United States Patent
Iwai et al.

(10) Patent No.: US 9,573,514 B2
(45) Date of Patent: Feb. 21, 2017

(54) ACTUATOR AND VEHICLE LIGHTING DEVICE

(71) Applicant: KOITO MANUFACTURING CO., LTD., Tokyo (JP)

(72) Inventors: Katsutoshi Iwai, Shizuoka (JP); Hiroshi Otaka, Shizuoka (JP); Takayuki Kato, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/765,656

(22) PCT Filed: Feb. 4, 2014

(86) PCT No.: PCT/JP2014/052559
§ 371 (c)(1),
(2) Date: Aug. 4, 2015

(87) PCT Pub. No.: WO2014/123118
PCT Pub. Date: Aug. 14, 2014

(65) Prior Publication Data
US 2015/0375671 A1 Dec. 31, 2015

(30) Foreign Application Priority Data

Feb. 5, 2013 (JP) .................. 2013-020792
Feb. 5, 2013 (JP) .................. 2013-020793
(Continued)

(51) Int. Cl.
*B60Q 1/115* (2006.01)
*B60Q 1/076* (2006.01)
(Continued)

(52) U.S. Cl.
CPC .............. *B60Q 1/076* (2013.01); *H02K 5/04* (2013.01); *H02K 5/225* (2013.01); *H02K 11/33* (2016.01);
(Continued)

(58) Field of Classification Search
CPC .......... B60Q 1/076; B60Q 1/06; B60Q 1/115; B60Q 1/04; H02K 11/33; H02K 5/04; H02K 5/225; H05K 5/0017; H05K 5/0217; F21S 48/00; F21S 48/10; F21S 48/1742; F21S 48/1736; F21V 14/00; F21V 14/02; F21V 21/00
See application file for complete search history.

(56) References Cited

U.S. PATENT DOCUMENTS 6,178,094 B1   1/2001  Hakozaki
6,616,302 B2 * 9/2003  Sugimoto .............. B60Q 1/076
                                                    362/272
(Continued)

FOREIGN PATENT DOCUMENTS

EP    2302989 A2    3/2011
JP    55-77190 A    6/1980
(Continued)

OTHER PUBLICATIONS

Int. Search Report dated May 20, 2014 issued in International Application No. PCT/JP2014/052559 (PCT/SA/210).
(Continued)

*Primary Examiner* — Bao Q Truong
(74) *Attorney, Agent, or Firm* — Sughrue Mion, PLLC

(57) ABSTRACT

A motor causes a shaft of an actuator to be displaced in an axis direction thereof, at least part of a circuit for driving the motor being mounted on a circuit board. A notch is formed in an end edge of the circuit board. A protrusion is formed
(Continued)

inside a case. The protrusion is fitted into the notch, whereby the circuit board is independently supported inside the case.

10 Claims, 16 Drawing Sheets

(30) Foreign Application Priority Data

Feb. 5, 2013 (JP) .................................. 2013-020794
Feb. 5, 2013 (JP) .................................. 2013-020795

(51) Int. Cl.
    *H02K 5/04* (2006.01)
    *H02K 5/22* (2006.01)
    *H05K 5/00* (2006.01)
    *H05K 5/02* (2006.01)
    *F21S 8/10* (2006.01)

(52) U.S. Cl.
    CPC .......... *H05K 5/0017* (2013.01); *H05K 5/0217* (2013.01); *B60Q 1/115* (2013.01); *F21S 48/1742* (2013.01)

(56) References Cited

U.S. PATENT DOCUMENTS

| | | | | |
|---|---|---|---|---|
| 7,445,365 | B1 * | 11/2008 | Hsu ........................ | B60Q 1/076 362/286 |
| 7,500,413 | B2 * | 3/2009 | Huang ................... | B60Q 1/076 362/467 |
| 7,994,670 | B2 * | 8/2011 | Ji ........................... | B60Q 1/076 310/83 |
| 9,272,661 | B2 * | 3/2016 | Koo ........................ | B60Q 1/076 |
| 9,428,102 | B2 * | 8/2016 | Tajima ................... | B60Q 1/076 |

FOREIGN PATENT DOCUMENTS

| | | |
|---|---|---|
| JP | 1-282047 A | 11/1989 |
| JP | 2001-163116 A | 6/2001 |
| JP | 2004-224066 A | 8/2004 |
| JP | 2006-287128 A | 10/2006 |
| JP | 2009-260051 A | 11/2009 |

OTHER PUBLICATIONS

Written Opinion dated May 20, 2014 issued in International Application No. PCT/JP2014/052559 (PCT/SA/237).
Communication dated Oct. 18, 2016 issued by the European Patent Office in counterpart European Application No. 14749384.5.

* cited by examiner

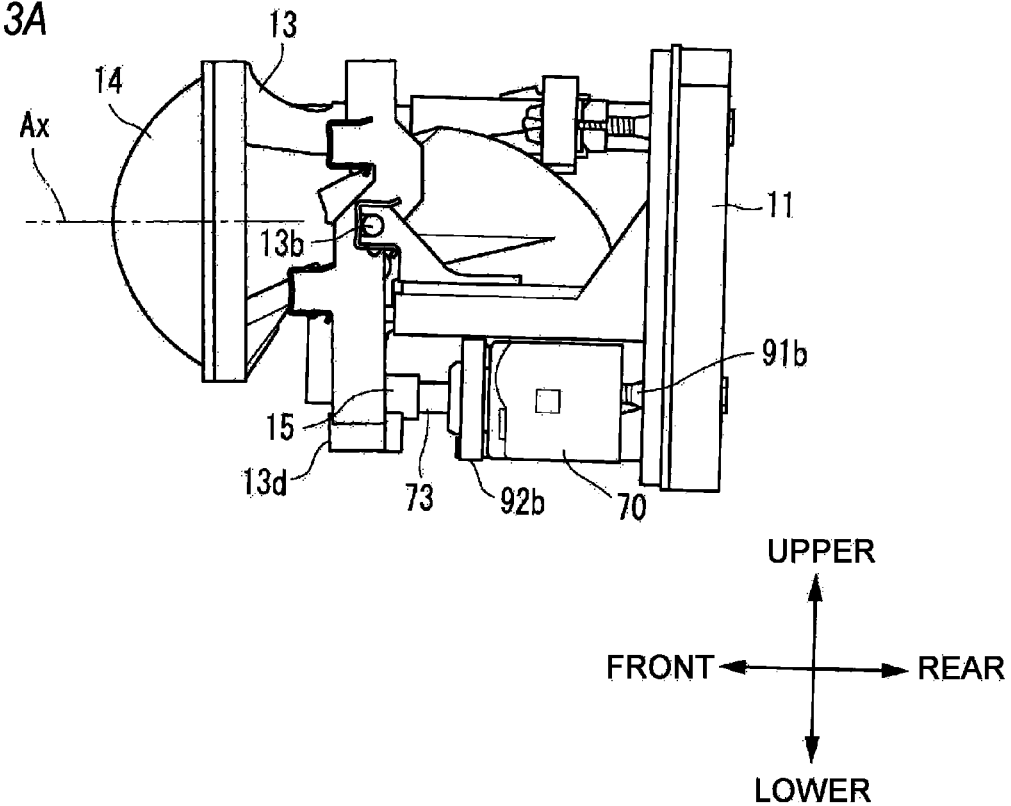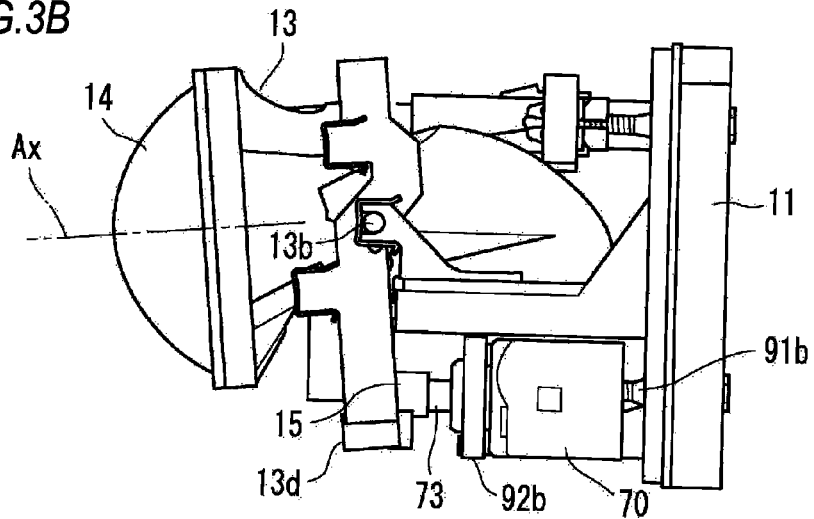

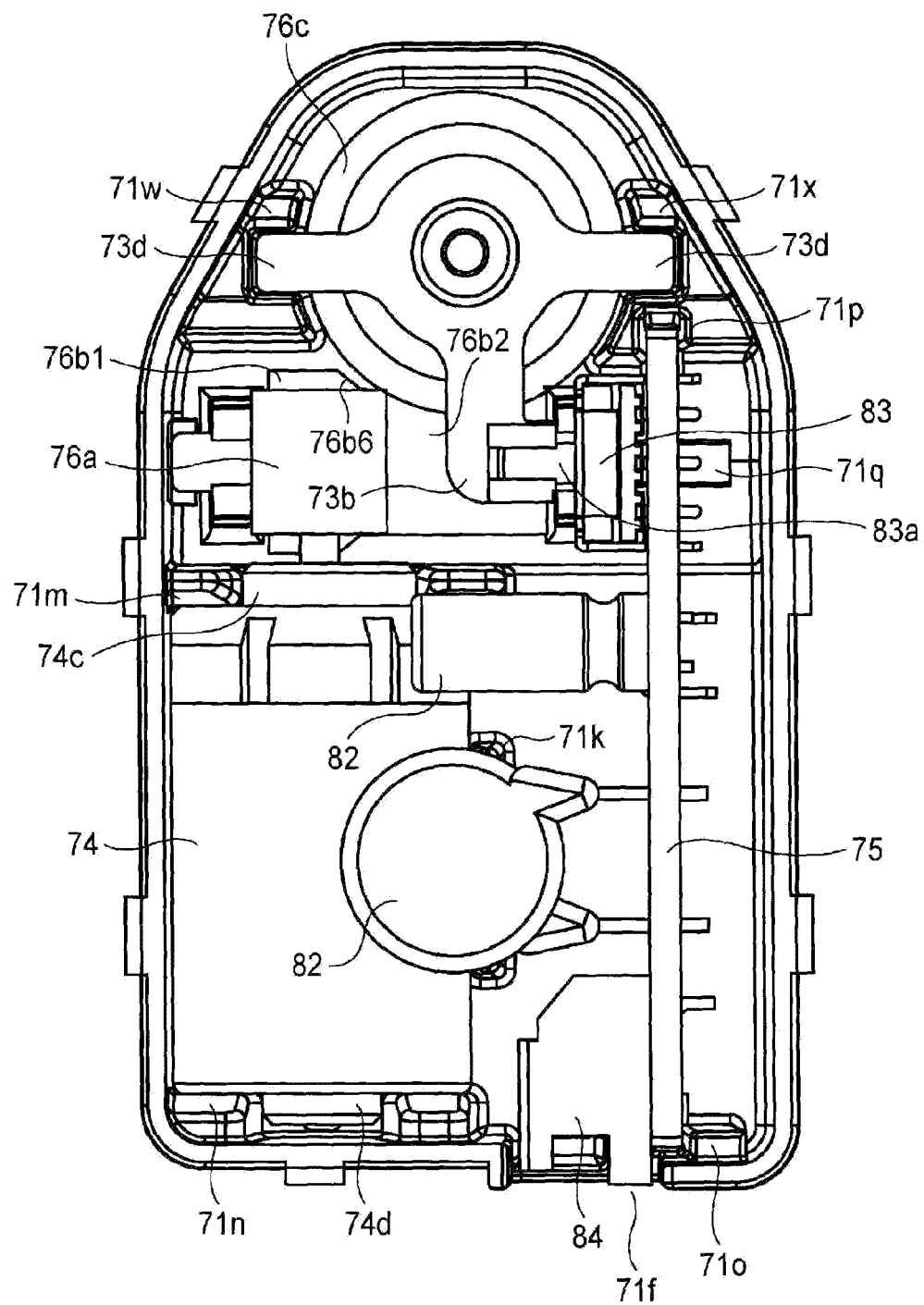

ACTUATOR AND VEHICLE LIGHTING DEVICE

TECHNICAL FIELD

The present invention relates to a circuit unit having a terminal mounted on a circuit board. Also, the present invention relates to an actuator having the circuit unit and configured to displace a shaft in an axis direction thereof, thereby displacing a target. Further, the present invention relates to a vehicle lighting device of which a part can be displaced in a predetermined direction by a shaft included in the actuator.

BACKGROUND ART

Patent Document 1 discloses a kind of the actuator. A shaft, a motor, a circuit board and a gear mechanism are accommodated in a case. A part of the shaft protrudes outside the case. At least a part of a circuit configured to drive the motor is mounted on the circuit board. A driving force of the motor is transmitted to the shaft by the gear mechanism and the shaft is displaced in an axis direction thereof. A tip of the shaft positioned outside the case is coupled to a part of a lighting device mounted to a vehicle. As the shaft is displaced, a direction of an optical axis of an optical system included in the lighting device is changed in a predetermined direction.

PRIOR ART DOCUMENT

Patent Document

[Patent Document 1] JP-A-2001-163116

SUMMARY OF THE INVENTION

Problems to be Solved

According to the configuration disclosed in Patent Document 1, a mounting surface of the circuit board on which the driving circuit is mounted is arranged inside the case to be perpendicular to an axis direction of the shaft. A plurality of protrusions arranged to surround a mounting area of the circuit board is formed inside the case. Each protrusion extends in the axis direction of the shaft. The circuit board is fitted in the mounting area with a plurality of places of a peripheral edge being sliding contacted to the protrusions. The circuit board accommodated inside the case is supported at its peripheral edge by the protrusions and is fixed in the mounting area.

That is, the circuit board is fitted in the mounting area with being pressed in the direction perpendicular to the mounting surface. At this time, the circuit board is likely to be bent due to the pressing force, so that a wiring, a contact, an electronic component and the like configuring the driving circuit may be damaged. Also, even after the circuit board is arranged in the mounting area, the circuit board is continuously applied with stress from the surrounding protrusions, so that the circuit board is likely to be distorted. The generated distortion may also be a cause of the damage of the driving circuit. The damage of the driving circuit may cause a failure in an operation of the actuator and an operation of the lighting device having the actuator.

It is therefore a first object of the present invention to suppress stress to be applied to a circuit board to be accommodated in a case and to prevent a damage of a motor driving circuit mounted on the circuit board.

In the configuration disclosed in Patent Document 1, the gear mechanism includes a worm gear mounted to a rotary shaft of the motor, an annular worm wheel mounted to the shaft and a transmission gear configured to transmit rotation of the worm gear to the worm wheel. The transmission gear has a pair of shaft parts. A bearing part formed inside the case has a pair of recesses. The pair of shaft parts is accommodated in the pair of recesses, so that the transmission gear is arranged at a predetermined position.

In the configuration disclosed in Patent Document 1, a position of the transmission gear with respect to the insertion direction to the bearing part is not sufficiently restrained. For this reason, when the transmission gear is rotated, the rattling occurs, so that an abnormal noise occurs during the operation of the actuator.

It is therefore a second object of the present invention to prevent an abnormal noise from occurring during an operation of an actuator.

In the configuration disclosed in Patent Document 1, the gear mechanism includes the annular worm wheel mounted to an outer periphery of the shaft. A screw part is formed on an inner periphery of the worm wheel. The screw part is screwed to a screw part formed on the outer periphery of the shaft. An engaging member is formed on an inner periphery of the case. The engaging member is configured to engage with a part of the worm wheel, thereby restraining an axial position thereof while enabling the worm wheel to rotate around the shaft. By this configuration, when the driving force of the motor is transmitted to rotate the worm wheel, the shaft is displaced in the axis direction thereof via the screwed part.

In the configuration disclosed in Patent Document 1, a cylindrical peripheral wall surrounding the outer periphery of the worm wheel is supported to a wall of the case in a cantilever shape. The peripheral wall is formed with the protrusions. The protrusions are engaged with the outer periphery of the worm wheel. In order to implement the corresponding shape, it is necessary to prepare a mold having a complicated structure, which increases the manufacturing cost. Also, when restraining the axial position of the worm wheel, a structure having higher strength is required.

It is therefore a third object of the present invention to implement a structure capable of securely restraining a position of a gear mechanism.

The circuit board having the motor driving circuit mounted thereon is mounted with a terminal for electrical connection between the motor or connector and the circuit, too. The circuit board is formed with a through-hole, a leg part of the terminal is inserted into the through-hole from a first side of the circuit board and a tip of the leg part protrudes from a second side of the circuit board. The terminal is fixed to the circuit board by bending the protruding part. The bent part is used for soldering, as required.

The terminal has a strength and corresponding thickness that is capable of securely supporting the motor and the connector. In the meantime, as the actuator is required to be made smaller, a space for accommodating a variety of components is limited, so that the terminal should also be made smaller. Under this situation, in order to bend the tip of the leg part for fixing of the terminal, a considerably strong force is required. The corresponding force applies a high stress to the circuit board damaging the wiring, the contact, the electronic components and the like configuring the driving circuit. The damage of the driving circuit may cause a failure in the operation of the actuator and the operation of the lighting device having the actuator.

It is therefore a fourth object of the present invention to suppress stress to be applied to a circuit board, thereby preventing a damage of a circuit mounted on the circuit board.

Means for Solving the Problems

In order to achieve the first object, according to a first aspect of the present invention, there is provided an actuator including:

a case having an opening;

a shaft accommodated inside the case and having a tip protruding towards an outside of the case through the opening;

a motor accommodated inside the case and configured to displace the shaft in an axis direction thereof; and a circuit board accommodated inside the case and having a mounting surface on which at least a part of a circuit configured to drive the motor is mounted, wherein an end edge of the circuit board is formed with a notch, wherein a protrusion is formed inside the case, and wherein the protrusion is fitted into the notch to independently support the circuit board inside the case.

According to the above configuration, since the circuit board is independently supported inside the case by the protrusion, it is possible to suppress the stress that is applied to the circuit board after the circuit board is arranged at a predetermined place. Therefore, it is possible to avoid a damage of the mounted circuit due to distortion of the circuit board and to stabilize an operation of the actuator and an operation of a lighting device having the actuator.

In order to achieve the first object, according to a second aspect of the present invention, there is provided a lighting device to be mounted on a vehicle which is configured so that a part thereof can be displaced in a predetermined direction by the shaft included in the actuator of the first aspect.

The notch and the protrusion may extend in a direction along which the circuit board is introduced into the case, and the direction along which the circuit board is introduced into the case may be parallel with the mounting surface.

In this case, the force for pressing the circuit board to the protrusion so as to tightly fit the protrusion and the notch to each other is applied in the direction parallel with the mounting surface, so that a force is applied to the side end edge of the circuit board. For this reason, as compared to a configuration where the pressing force is applied in a direction perpendicular to the mounting surface, it is possible to considerably suppress the bending of the circuit board. Therefore, it is possible to avoid the damage of the mounted circuit, which is caused due to the distortion of the circuit board occurring when introducing the circuit board into the case, and to stabilize an operation of the actuator and an operation of the lighting device having the actuator.

The case may be formed therein with a rail extending in the direction along which the circuit board is introduced into the case, and a gap may be formed between the circuit board and the rail at a state where the circuit board is supported by the protrusion.

In this case, it is possible to smoothly perform the operation of introducing the circuit board into the case by the rail, and after the circuit board is arranged at the predetermined position, the rail does not apply the stress, which is a cause of the distortion, to the circuit board. Therefore, it is possible to stabilize an operation of the actuator and an operation of the lighting device having the actuator.

The circuit board may be arranged inside the case so that the mounting surface is parallel with the axis direction of the shaft.

In this case, as compared to a configuration where the mounting surface is arranged to be perpendicular to the axis direction of the shaft, it is possible to remarkably reduce a width size of the case for which miniaturization is more required than the displacement direction of the shaft, i.e., the axis direction. Therefore, it is possible to make the actuator small while suppressing the stress to be applied to the circuit board accommodated inside the case. Further, it is possible to miniaturize the lighting device having the actuator.

Here, the motor may be arranged at a position facing the mounting surface inside the case, and the case may be formed therein with a partition member to be inserted between the motor and the mounting surface.

In this case, even when a movement of rotating around the rotary shaft is generated for the motor as the motor is driven, it is possible to prevent the interference with an electronic component mounted on the circuit board. Therefore, it is possible to stabilize an operation of the actuator and an operation of the lighting device having the actuator while suppressing the stress to be applied to the circuit board accommodated inside the case.

The mounting surface may be mounted thereon a terminal to be electrically connected to the driving circuit and to be inserted into the motor. In this case, the terminal includes a first part extending in a direction perpendicular to the mounting surface and a second part provided at a predetermined distance from a tip of the first part and extending in a direction parallel with the mounting surface.

According to the above configuration, the motor abuts on a stopper with the terminal being inserted into a commutator terminal by a predetermined length, so that the terminal is not further inserted. In other words, the motor is configured in a position where it is not brought close to the mounting surface by the predetermined distance or longer. An operator can complete the mounting operation on the circuit board simply by pressing the motor to the terminal without particularly considering the insertion length. Therefore, it is possible to improve the mounting operability while suppressing the stress to be applied to the circuit board accommodated inside the case.

The case may be formed with a holder having a recess. The holder may be configured to hold the motor inside the case by inserting a part of the motor into the recess. In this case, the recess has a shape of which a width increases towards an entry thereof.

According to the above configuration, it is possible to easily introduce a part of the motor into the recess. The motor is introduced to a predetermined position along the recess of which width is gradually narrowed, and is firmly held. In this way, it is possible to smoothly perform the motor introducing operation. Therefore, it is possible to improve the mounting operability while suppressing the stress to be applied to the circuit board accommodated inside the case.

The case may have a box member having an opening part and a cover member configured to close the opening part. In this case, one side of the box member is formed with a slit configured to communicate with the opening part. The mounting surface is mounted thereon with a connector electrically connected to the driving circuit. At a state where the circuit board is accommodated in the box member through the opening part, a part of the connector is arranged in the slit. At a state where the cover member closes the opening part, a part of the cover member closes a part of the slit.

According to the above configuration, it is possible to prevent static electricity from being introduced by closing the gap formed around the connector. Thereby, it is possible to prevent an unexpected malfunction or damage of the driving circuit accompanied by the static electricity. Therefore, it is possible to stabilize an operation of the actuator and an operation of the lighting device having the actuator while suppressing the stress to be applied to the circuit board accommodated inside the case.

The case may be formed with a screw hole at a position coaxial with the shaft.

In this case, it is possible to arrange a device for adjusting an initial position of the actuator such as an aiming screw of a vehicle lighting device so that it is coaxial with the shaft. Therefore, it is possible to stabilize an operation of the actuator and an operation of the lighting device having the actuator while suppressing the stress to be applied to the circuit board accommodated inside the case.

In order to achieve the second object, according to a third aspect of the present invention, there is provided an actuator including:

a shaft accommodated inside the case and having a tip protruding towards an outside of the case through the opening;

a motor accommodated inside the case; and a gear mechanism accommodated inside the case and configured to displace the shaft in an axis direction thereof by driving of the motor, wherein the gear mechanism includes a first gear mounted on a rotary shaft of the motor, a second annular gear mounted on the shaft and a third gear configured to transmit rotation of the first gear to the second gear, wherein the third gear includes a pair of shaft parts, wherein the case is formed therein with a bearing part configured to hold the pair of shaft parts, wherein the bearing part includes a pair of recesses into which the pair of shaft parts is inserted, and wherein each entry of the pair of recesses is formed to be narrower than a maximum diameter of the shaft part.

According to the above configuration, each shaft is introduced into the recess with flaring the entry thereof when mounting the third gear. When the shaft part is arranged at a predetermined position, the entry of the recess is returned to its original position to prevent the shaft part from separating from the recess. Therefore, a position of the third gear with respect to the insertion direction to the bearing part is restrained and is firmly held, so that the rattling is suppressed upon rotation of the third gear. Thereby, it is possible to suppress an abnormal noise during the operation of the actuator.

The case may be formed therein with a pair of seat parts each of which has a support surface, and the support surface may be configured to support a part of the shaft part positioned outside the recess.

When a mold configured to form the case is deteriorated, it is not possible to obtain the recess of the bearing part having a predetermined size, as designed. However, according to the above configuration, since the support surface of the seat part is configured to support a part of the shaft part and thus to restrain a position of the shaft part in the insertion direction, it is possible to reduce the impact of a size change. In other words, even the bearing part manufactured by a slightly deteriorated mold can keep the effect of suppressing the rattling of the third gear, i.e., the effect of suppressing the abnormal noise of the actuator. Thereby, it is possible to prolong a useable life of the mold. Therefore, it is possible to suppress the manufacturing cost while suppressing the abnormal noise during the operation of the actuator.

The third gear may have a gear part between the pair of shaft parts, and a stepped part wider than the recess may be provided between the gear part and at least one of the pair of shaft parts.

In this case, the stepped part is arranged to abut on a side of the bearing member defining the recess. Thereby, a position of the third gear in the axis direction is restrained. That is, it is possible to suppress the axial displacement upon the rotation of the third gear, even in a layout where the axial position cannot be restrained by a wall of the case. Therefore, it is possible to suppress the abnormal noise during the operation of the actuator.

A peripheral part of a tip surface of at least one of the pair of shaft parts may be chamfered.

According to the above configuration, it is possible to reduce a contact area between the tip surface of the shaft part and the wall of the case, in a layout where the axial position is restrained by the wall of the case. Therefore, it is possible to smoothly rotate the third gear while suppressing the abnormal noise during the operation of the actuator.

The third gear may include a first gear part and a second gear part of which maximum diameter is smaller than the first gear part, and a part of the first gear part may be configured by an inclined surface inclined towards the second gear part.

According to the above configuration, a space resulting from the formation of the inclined surface may be used to arrange the other element components to be accommodated inside the case. This configuration increases the utilization efficiency of the internal space of the case. In other words, it is possible to arrange the element components as close as possible. Therefore, it is possible to make the case, i.e., the actuator small while suppressing the abnormal noise during the operation of the actuator.

In order to achieve the second object, according to a fourth aspect of the present invention, there is provided a lighting device to be mounted on a vehicle which is configured so that a part thereof can be displaced in a predetermined direction by the shaft included in the actuator according to the third aspect.

In order to achieve the third object, according to a fifth aspect of the present invention, there is provided an actuator including:

a case including a cylindrical shape part having an opening;

a shaft accommodated inside the case and having a tip protruding towards an outside of the case through the opening;

a motor accommodated inside the case; and a gear mechanism accommodated inside the case and configured to displace the shaft in an axis direction thereof by driving of the motor, wherein an outer periphery of the shaft is formed with a first screw part, wherein the gear mechanism includes an annular member having a gear, wherein a second screw part formed on an inner periphery of the annular member is screwed with the first screw part, whereby the shaft is displaced in the axis direction thereof as the gear is rotated, wherein the cylindrical shape part has a single peripheral wall defining a space in which a part of the annular member is accommodated, and wherein a protrusion formed as a part of the peripheral wall having an increased thickness is engaged with a part of the annular member.

According to the above configuration, the annular member is accommodated in the accommodation space to be rotatable around the shaft with the axial displacement thereof being restrained. Since the protrusion which enables secure restraint is formed monolithically by increasing the thickness of a portion of the single peripheral wall, sufficient strength can be secured. Also, it is possible to remarkably simplify the mold for obtaining the corresponding configuration. Therefore, it is possible to suppress the manufacturing cost.

A part of the protrusion to be engaged with a part of the annular member may be configured by an inclined surface inclined towards an axis direction of the annular member.

According to the above configuration, the protrusion and the annular member can be smoothly engaged with each other. When the inclined surface is a surface perpendicular to the axis direction of the annular member, it is necessary to configure the annular member to be deformable in a radially inward direction so as to facilitate the engaging. For example, when the annular member is formed with a slit, the corresponding deformation is possible. In this case, it is not possible to avoid the rigidity degradation of the annular member. However, according to the above configuration, since it is possible to secure the rigidity of the annular member, the deformation, which is caused due to the load, is suppressed. Therefore, it is possible to keep the stable rotating operation while suppressing the manufacturing cost.

The shaft may be formed with a plurality of protrusions extending in a radial direction thereof, and a rail formed as a part of a wall of the case having an increased thickness may be configured to abut on tips of the plurality of protrusions.

According to the above configuration, it is possible to restrain a radial position of the shaft that is displaced in the axis direction thereof as the motor is driven. Also, since the position restraint is performed at a place of which rigidity is improved by a part of a wall of the case that has an increased thickness, the restraint capability is unlikely to be deteriorated even when the shaft is repeatedly displaced. Therefore, it is possible to suppress the degradation of the position restraining capability for the shaft while suppressing the manufacturing cost.

The rail may have a rib configured to support each tip of the protrusions from both sides.

According to the above configuration, it is possible to restrain a position of the shaft with respect to a direction perpendicular to the extending direction of the protrusion. Thereby, the shaft can be smoothly displaced. Therefore, it is possible to suppress shaking and vibration of the displacement shaft or abnormal noise while suppressing the manufacturing cost.

In order to achieve the third object, according to a sixth aspect of the present invention, there is provided a lighting device to be mounted on a vehicle which is configured so that a part thereof can be displaced in a predetermined direction by the shaft included in the actuator according to the fifth aspect.

In order to achieve the fourth object, according to a seventh aspect of the present invention, there is provided a circuit unit including:
a circuit board having a plurality of through-holes; and
a terminal including a plurality of leg parts, wherein the terminal is arranged on a first side of the circuit board by inserting the leg parts into the through-holes, wherein each tip portion of the leg parts is bent on a second side of the circuit board, wherein each of the leg parts is narrowed at a part including the tip portion, and wherein at least a part of the narrowed part is arranged in the through-hole.

According to the above configuration, it is possible to considerably suppress a force necessary to bend the tip portion of each leg part. Thereby, it is possible to suppress the stress to be applied to the circuit board upon the bending operation, thereby preventing a damage of the circuit board or mounted circuit element. Therefore, it is possible to stabilize an operation of the actuator and an operation of a lighting device having the actuator.

In order to achieve the fourth object, according to an eighth aspect of the present invention, there is provided an actuator including:
a case having a cylindrical shape part having an opening;
a shaft accommodated inside the case and having a tip protruding towards an outside of the case through the opening; and
a motor accommodated inside the case and configured to displace the shaft in an axis direction thereof, wherein at least a part of a driving circuit configured to drive the motor is mounted on the circuit board included in the circuit unit.

Also, in order to achieve the fourth object, according to a ninth aspect of the present invention, there is provided a lighting device to be mounted on a vehicle which is configured so that a part thereof can be displaced in a predetermined direction by the shaft included in the actuator.

The second side of the circuit board may be formed thereon with a land adjacent to only one of the through-holes. In this case, only one of the leg parts inserted into one through-hole surrounded by the land is soldered to the land.

According to the above configuration, it is possible to prevent an area in which the solder does not exist. Thereby, it is possible to improve an appearance of the soldered part, thereby avoiding a situation where the soldered part is wrongly recognized as a defect. Also, it is possible to reduce an amount of the solder to be used, thereby suppressing the manufacturing cost and the environmental impact. Therefore, it is possible to accomplish the corresponding effects while preventing the damage of the circuit board or mounted circuit element.

BRIEF DESCRIPTION OF THE DRAWINGS

FIGS. 3A and 3B are left side views illustrating an operation of an actuator included in the lamp unit.

FIG. 12 illustrates an inside of the box member having a variety of components accommodated therein.

DETAILED DESCRIPTION OF ILLUSTRATIVE EMBODIMENTS

An illustrative embodiment of the present invention will be described in detail with reference to the accompanying drawings. Meanwhile, in the respective drawings used in the below descriptions, a scale is appropriately changed so as to show each member as a recognizable size.

Figure 1:
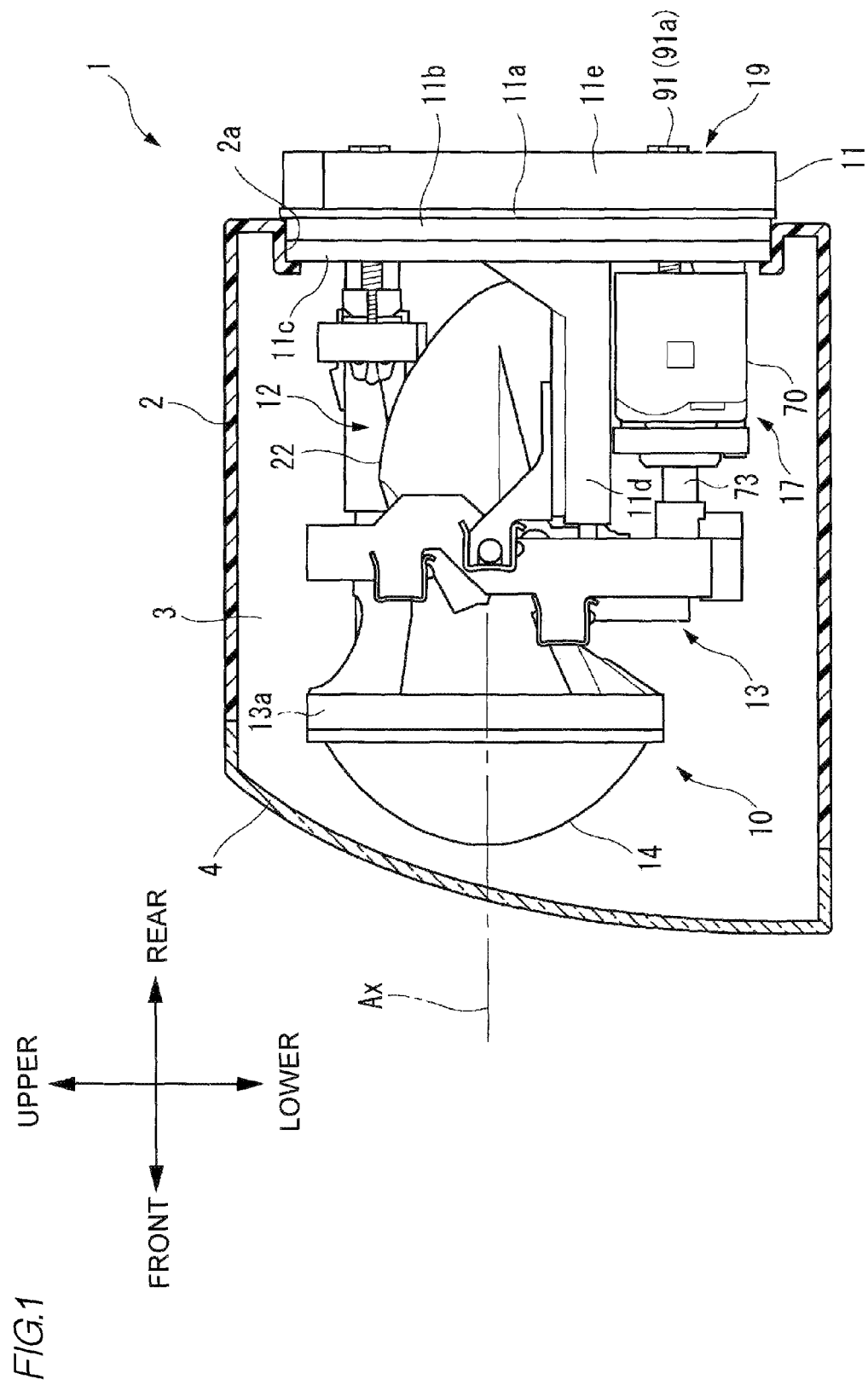
FIG. 1 is a partially sectional left side view illustrating a configuration of a lighting device according to an illustrative embodiment of the present invention.

FIG. 1 illustrates a part of a headlight device 1, which is an example of the lighting device according to an illustrative embodiment of the present invention, as seen from a vertically sectioned left side. The headlight device 1 is a device mounted at a front part of a vehicle and configured to illuminate the front of the vehicle. The headlight device 1 has a housing 2, and a translucent cover 4 mounted to the housing 2 and configured to define a lamp chamber 3. In the lamp chamber 3, a lamp unit 10 is arranged.

The lamp unit 10 has a heat sink 11, a light source unit 12, a lens holder 13, a projection lens 14, an actuator 17 and an aiming mechanism 19.

The heat sink 11 has a back plate part 11a extending in vertical and horizontal directions. A substantially rectangular frame part 11b extends forward on a front surface of the back plate part 11a, and a gasket 11c is attached to a tip of the frame part. A support part 11d extends forward on an inner side of the frame part 11b on the front surface of the back plate part 11a. A backside of the back plate part 11a is formed with a plurality of radiator plates 11e. Each radiator plate 11e extends in the vertical direction.

A backside of the housing 2 is formed with an opening 2a having the same shape as the frame part 11b of the heat sink 11. The lamp unit 10 is introduced into the lamp chamber 3 from a front part of the lamp unit 10 through the opening 2a, and the frame part 11b is fitted into the opening 2a, so that the opening 2a is closed from the backside by the back plate part 11a of the heat sink 11. The lamp chamber 3 is sealed to be watertight by the gasket 11c.

The light source unit 12 has a reflector 22. In the reflector 22, a light source (not shown) is arranged. The reflector 22 and the light source are fixed to the support part 11d of the heat sink 11. An inner surface of the reflector 22 having a dome shape is configured as a reflecting surface and is arranged to face the light source.

The projection lens 14 is a plane-convex aspheric lens of which an emission surface is convex and an incidence surface is planar. The light emitted from the light source is reflected forward by the inner surface of the reflector 22, and at least a part of the light passes through the projection lens 14. The light having passed through the projection lens 14 illuminates the front through the translucent cover 4.

Figure 2:
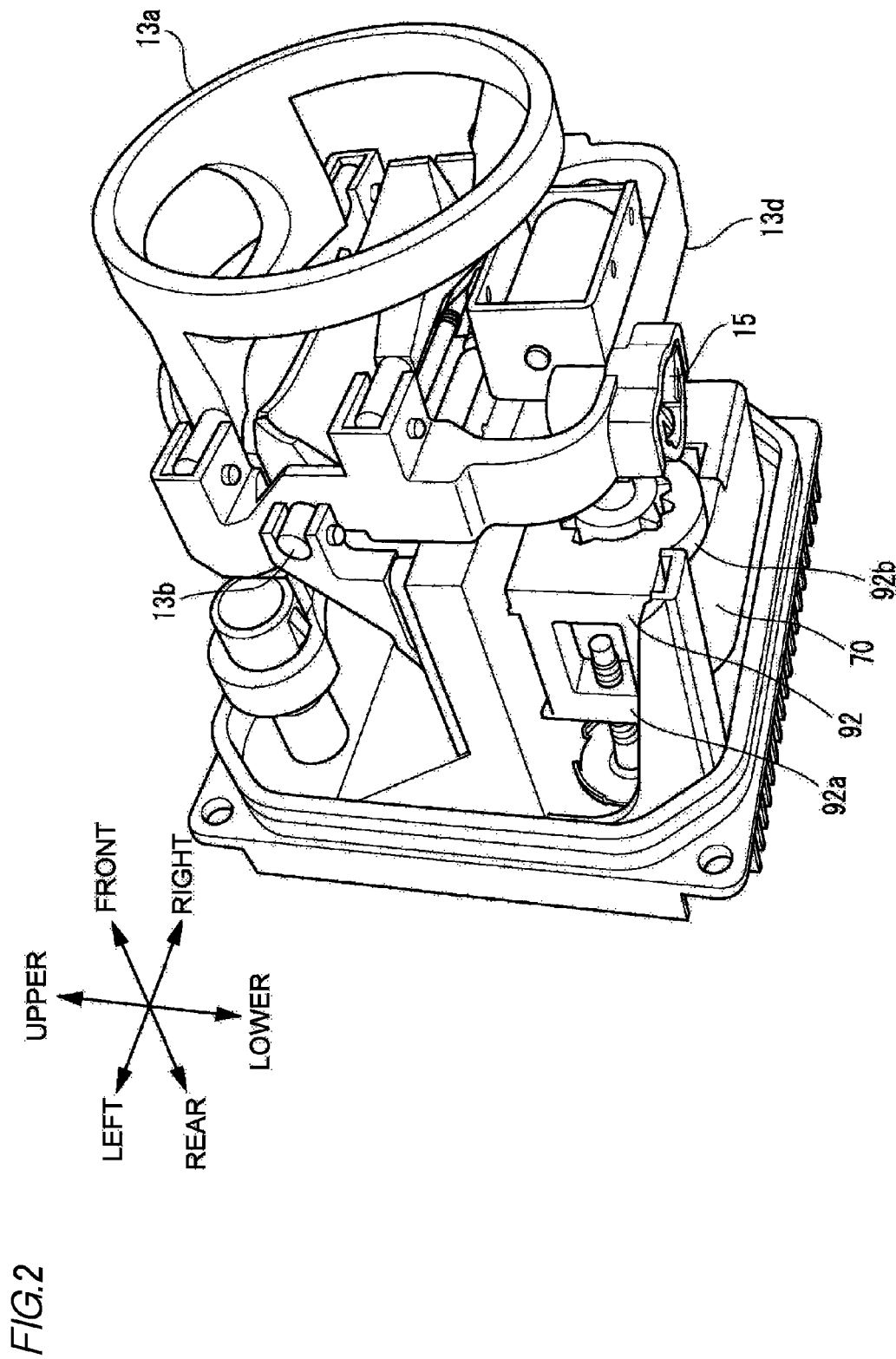
FIG. 2 is a perspective view illustrating a part of a lamp unit included in the lighting device.

The lens holder 13 is arranged in front of the reflector 22. The lens holder 13 has a lens holding part 13a, the lens holding part 13a is an annular frame and the projection lens 14 is fixed to a front surface of the lens holding part. As shown in FIG. 2, a joint member 15 is provided in the vicinity of a left side of a lower part of the lens holder 13.

As shown in FIG. 1, the actuator 17 is arranged below the support part 11d of the heat sink 11 at the rear of the lens holder 13. The actuator 17 has a case 70 and a shaft 73. A driving circuit provided inside the case 70 is configured to receive a control signal from a control unit (not shown) provided outside the lamp unit 10. The shaft 73 is configured to advance and retreat with respect to the case 70, in response to the control signal. The actuator 17 is arranged so that a tip of the shaft 73 faces forward. The tip of the shaft 73 is coupled to the joint member 15.

The aiming mechanism 19 has an aiming screw 91 and a joint member 92. The aiming screw 91 has a head part 91a and a shaft part 91b. The head part 91a is arranged on a left-lower backside of the back plate part 11a of the heat sink 11 and is exposed to an outside of the housing 2. The shaft part 91b penetrates the back plate part 11a of the heat sink 11 and extends forward inside the frame part 11b. An outer periphery of the shaft part 91b is formed with a screw recess.

As shown in FIG. 2, the joint member 92 has a first joint part 92a and a second joint part 92b. The first joint part 92a is formed with an insertion hole. An inner periphery of the insertion hole is formed with a screw recess. The shaft part 91b of the aiming screw 91 is inserted into the insertion hole formed at the first joint part 92a of the joint member 92, so that the screw recesses of the shaft part 91b and the first joint part 92a are screwed with each other. The second joint part 92b is coupled with a part of the case 70 of the actuator 17.

When the head part 91a of the aiming screw 91 is rotated by a common jig (not shown), a screwing position between the shaft part 91b and the first joint part 92a of the joint member 92 is changed and the joint member 92 is displaced backward and forward. Since the joint member 92 is coupled with the case 70 of the actuator 17, the actuator 17 is also displaced backward and forward as the aiming screw 91 is rotated.

Accompanied by this, a lower part 13d of the lens holder 13 is pressed forward or pulled backward. Therefore, an optical axis Ax of the projection lens 14 supported to the lens holder 13 is also inclined upward or downward. That is, when the head part 91a of the aiming screw 91 is operated, a reference position of the actuator 17, i.e., a reference position of the optical axis Ax of the projection lens 14 with respect to the vertical direction is adjusted.

The actuator 17 is a mechanism configured to change a direction of the optical axis Ax of the projection lens 14 in the vertical direction of the vehicle as the vehicle is changed due to the number of passengers and the loaded luggage. FIG. 3A illustrates a state where the optical axis Ax of the projection lens 14 is somewhat inclined downward by the operation of the aiming screw 91. FIG. 3B illustrates a state where the actuator 17 is operated from the state of FIG. 3A to retract the shaft 73 backward.

As the shaft 73 is retracted, the lower part 13d of the lens holder 13 is further pulled backward. The lens holder 13 is rotated about a support shaft 13b and is further inclined downward. Also, the optical axis Ax of the projection lens 14 supported to the lens holder 13 is further inclined downward.

That is, the optical axis Ax can be vertically displaced by further advancing and retreating the driving shaft of the actuator 17 on the basis of the position of the optical axis Ax of the projection lens 14 adjusted by the operation of the aiming screw 91.

Subsequently, a configuration of the actuator 17 is described with reference to an exploded perspective view of FIG. 4. The actuator 17 has a box member 71, a cover member 72, a shaft 73, a motor 74, a circuit board 75 and a gear mechanism 76. The gear mechanism 76 includes a worm gear 76a (which is an example of the first gear), a transmission gear 76b (which is an example of the third gear) and a worm wheel 76c (which is an example of the second gear).

The box member 71 is formed to define an internal space 71a. One side of the box member 71 is configured as an opening part 71b opening the internal space 71a. The shaft 73, the motor 74, the circuit board 75 and the gear mechanism 76 are introduced into the internal space 71a through the opening part 71b and are arranged at predetermined places, which will be described later. The cover member 72 is mounted to the box member 71 to close the opening part 71b, so that the case 70 is formed.

A part of an outer periphery of the shaft 73 is formed with a first screw part 73a. An inner periphery of the annular worm wheel 76c is formed with a second screw part 76c1. When the second screw part 76c1 is screwed to the first screw part 73a, the worm wheel 76c is mounted to surround a part of the outer periphery of the shaft 73.

A motor driving circuit 80 including a terminal 81, an electronic component 82 and a potentiometer 83 is mounted on a mounting surface 75a of the circuit board 75. The electronic component 82 may include an IC, a surge absorber and the like. Also, a connector 84 electrically connected to the motor driving circuit 80 is mounted on the mounting surface 75a. The connector 84 is provided to transmit and receive a signal to and from an external control circuit (not shown). The circuit unit is configured by these components.

The motor 74 is a DC motor having a common configuration. The terminal 81 of the motor driving circuit 80 is connected to a commutator terminal 74b (refer to FIGS. 6A and 6B) of the motor 74, so that the driving of the motor 74 can be controlled.

The worm gear 76a is mounted to a rotary shaft 74a of the motor 74. The transmission gear 76b has a worm wheel part 76b1 (which is an example of the first gear part) and a worm gear part 76b2 (which is an example of the second gear part). The worm gear 76a is meshed with the worm wheel part 76b1 and the worm gear part 76b2 is meshed with the worm wheel 76c, so that the driving force of the motor 74 is transmitted to the worm wheel 76c.

As the rotary shaft 74a is rotated, the worm wheel 76c is rotated around the shaft 73. Depending on the rotating direction and rotation amount, the screwed state between the first screw part 73a of the shaft 73 and the second screw part 76c1 of the worm wheel 76c is changed and the shaft 73 is axially advanced and retreated.

One end portion of the shaft 73 is provided with a joint member 73b. The joint member 73b is engaged with a rod 83a included in the potentiometer 83 on the circuit board 75. As the shaft 73 is displaced, a position of the rod 83a is changed, and the motor driving circuit 80 can determine a position of the shaft 73 by the position of the rod. The motor driving circuit 80 is configured to determine whether it is necessary to continuously drive the motor 74, depending on a result of the determination.

Figure 5:
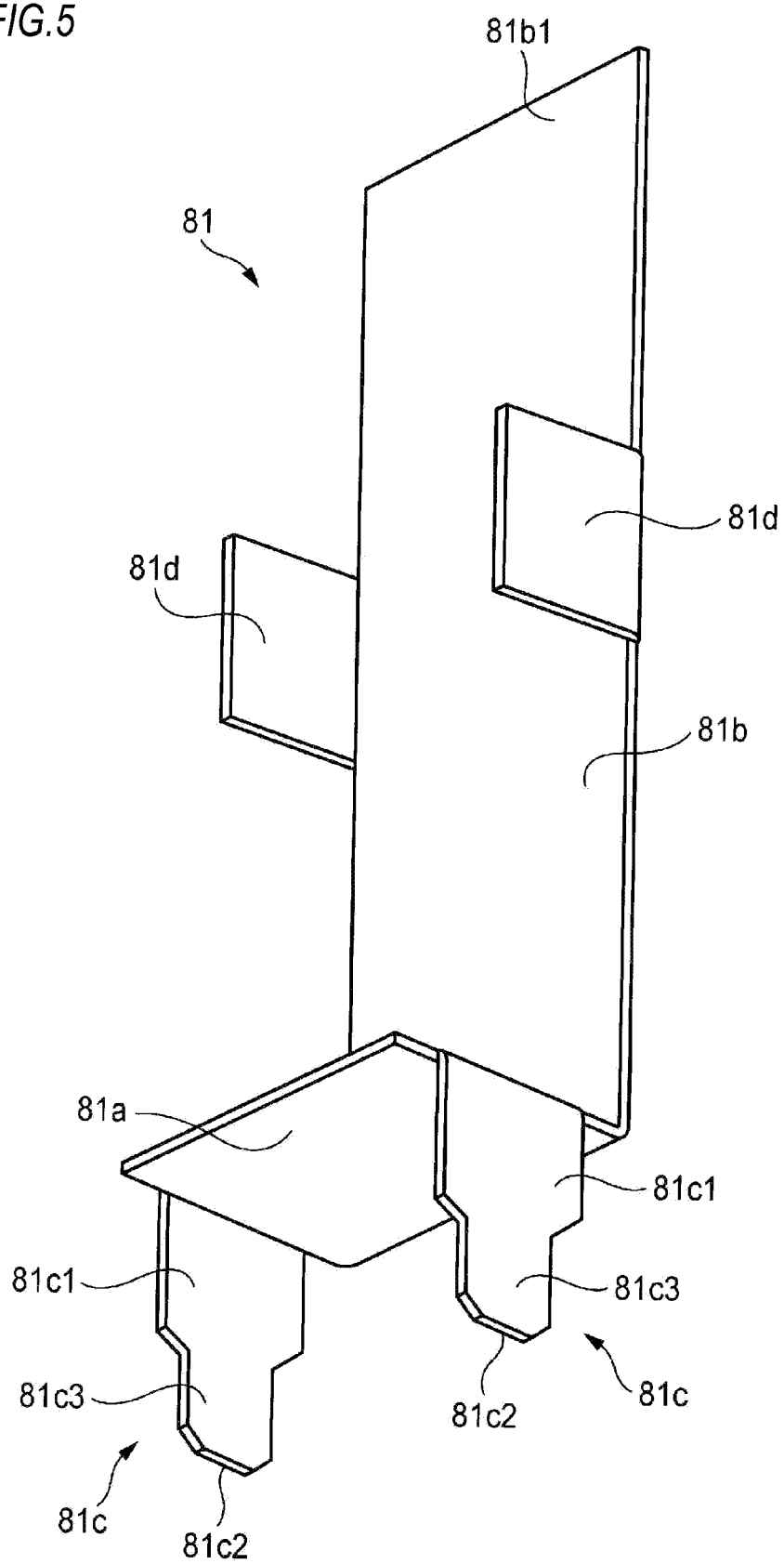
FIG. 5 is a perspective view illustrating an outward appearance of a terminal mounted on a circuit board included in the actuator.

FIG. 5 is a perspective view illustrating a configuration of the terminal 81 included in the motor driving circuit 80. The terminal 81 is formed by bending one die-cut plate. The terminal 81 has a base part 81a, an upright part 81b and a pair of leg parts 81c.

The base part 81a is a part that contacts the mounting surface 75a and extends in parallel with the mounting surface 75a at a state where the terminal 81 is mounted on the circuit board 75. The upright part 81b is a part bent to extend vertically with respect to the base part 81a. That is, the upright part 81b is a part that extends in a direction perpendicular to the mounting surface 75a at the state where the terminal 81 is mounted on the circuit board 75.

Figure 6A:
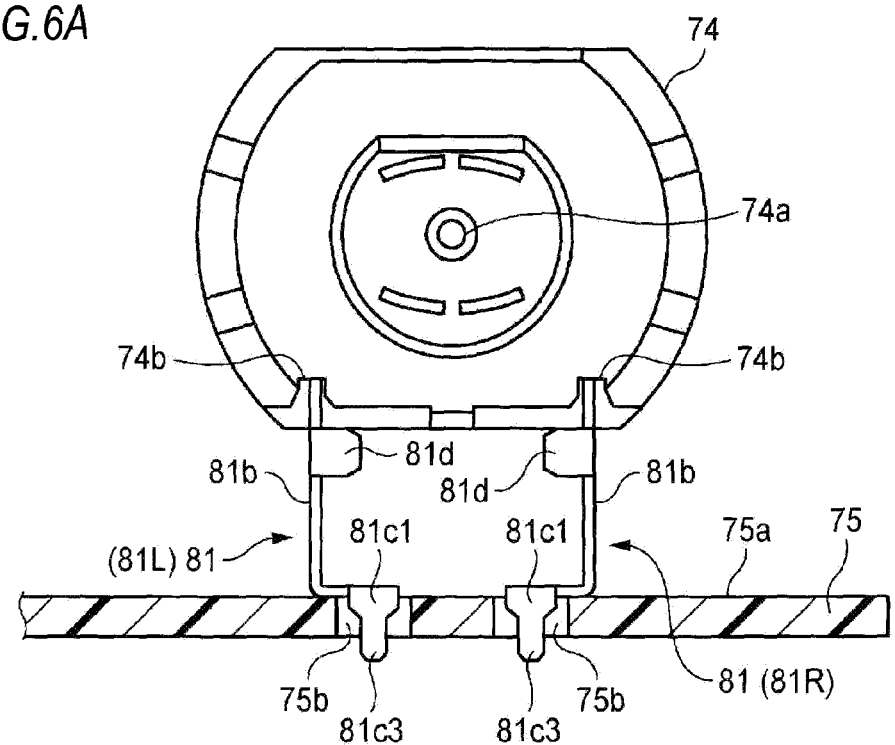
FIGS. 6A and 6B illustrate a method of mounting the terminal on the circuit board.

The pair of leg parts 81c is parts that are vertically bent from side end portions of the base part 81a towards an opposite direction to the upright part 81b. Each of the leg parts 81c has a base end portion 81c1, a tip portion 81c2 and a narrow portion 81c3. The base end portion 81c1 continues to the base part 81a. The narrow portion 81c3 includes the tip portion 81c2 and is formed to be narrower than the base end portion 81c1. As shown in FIG. 6A, each leg part 81c is inserted into a through-hole 75b formed at the circuit board 75. At this time, the tip portion 81c2 protrudes from an opposite side (which is an example of the second side of the circuit board) to a side (which is an example of the first side of the circuit board) of the circuit board 75, on which the base part 81a is arranged. Also, at least a part of the narrow portion 81c3 is arranged in the through-hole 75b.

Figure 6B:
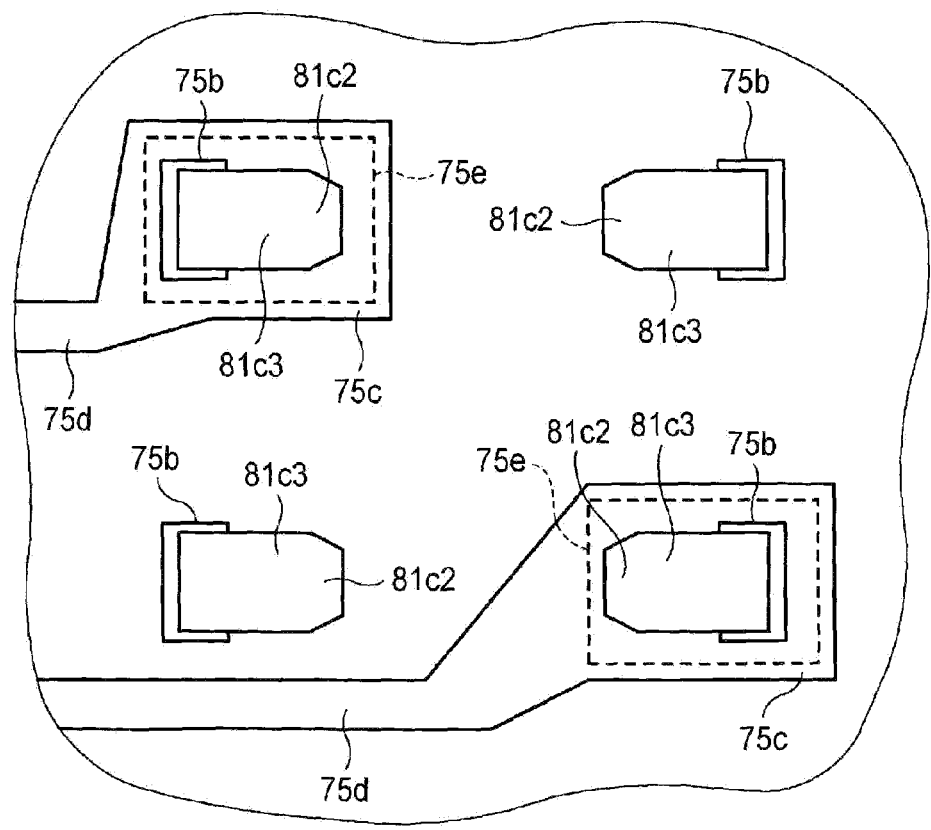

As shown in FIG. 6B, the tip portion 81c2 of each leg part 81c is bent to extend substantially parallel with the circuit board 75. Thereby, the terminal 81 is fixed on the circuit board 75. The terminal 81 has a predetermined thickness so as to secure the rigidity capable of supporting the motor 74. From a standpoint of space saving, it is necessary to make an entire size of the terminal 81 as small as possible. Under this condition, a very strong force is required to bend the tip portion 81c2 of each leg part 81c. The circuit board 75 or a circuit element mounted thereon may be damaged by stress applied upon the bending.

However, according to the illustrative embodiment, each leg part 81c has the narrow portion 81c3. The narrow portion 81c3 includes the tip portion 81c2 and is narrower than the base end portion 81c1. Also, at least a part of the narrow portion 81c3 is arranged in the through-hole 75b. For this reason, it is possible to remarkably suppress the force required to bend the tip portion 81c2 of each leg part 81c. Therefore, it is possible to suppress the stress applied to the circuit board 75 upon the bending operation, thereby preventing the circuit board 75 or a circuit element mounted thereon from being damaged.

Regarding the tip portions 81c2 of the four leg parts 81c shown in FIG. 6B, the two upper tip portions and the two lower tip portions belong to the same terminals 81, respectively. Specifically, the two upper tip portions belong to a terminal 81R shown in FIG. 6A, and the two lower tip portions belong to a terminal 81L shown in FIG. 6A. That is, the two upper tip portions 81c2 are made to be conductive to each other, and the two lower tip portions 81c2 are made to be conductive to each other.

In the illustrative embodiment, a land 75c is formed to be adjacent to only one of a pair of through-holes 75b into which the pair of leg parts 81c is inserted. A wiring pattern 75d extends from the land 75c. Only the tip portion 81c2 of the leg part 81c inserted into the through-hole 75b adjacent to the land 75c is soldered to the land 75c. A dotted line on the land 75c indicates a solder 75e.

If the land is formed to be adjacent to both the pair of through-holes 75b, an area in which a solder does not exist on a part of the land may occur, and the corresponding area may be determined as a defect. A possible reason for this is that even when a widely spread amount of solder is applied over the entire land, the solder is concentrated on a tip portion of the terminal due to the surface tension.

According to the above configuration, it is possible to suppress the influence of the surface tension to the minimum, thereby preventing the area in which the solder does not exist. Thereby, an appearance of the soldered part is improved, so that it is possible to avoid a situation where the corresponding part is wrongly recognized as a defect. Also, it is possible to reduce an amount of the solder 75e to be used, thereby suppressing the manufacturing cost and the environmental impact. As described above, the pair of leg parts 81c is electrically connected. Therefore, even when the soldering is not applied to one through-hole 75b, the function of the terminal 81 can be kept. Also, since it is possible to securely bend the tip portion 81c2, it is possible to keep the fixed state of the terminal to the circuit board 75.

As shown in FIG. 5, a pair of stoppers 81d (which is an example of the second part of the terminal) extending in parallel with the base part 81a, i.e., the mounting surface 75a of the circuit board 75 is further provided for the terminal 81 in the vicinity of a central part of the upright part 81b (which is an example of the first part of the terminal) in the longitudinal direction.

As shown in FIG. 6A, when the terminal 81 mounted as described above is inserted into the commutator terminal 74b of the motor 74, the motor 74 is arranged at a position facing the mounting surface 75a of the circuit board 75.

The commutator terminal 74b of the motor 74 is not provided with a configuration for stopping the terminal introduction by a predetermined degree. For this reason, it is necessary to consider an insertion length of the terminal so as to prevent the motor, into which the terminal is excessively inserted, from being excessively brought close to the mounting surface of the circuit board to damage the other circuit components and the like, or so as to prevent the excessively inserted terminal from damaging an inside of the motor. This may deteriorate the mounting operability.

According to the illustrative embodiment, the stopper 81d extends in a direction parallel with the mounting surface 75a of the circuit board 75 at a predetermined position from a tip portion 81b1 of the upright part 81b. For this reason, when the terminal 81 is inserted into the commutator terminal 74b of the motor 74 by a predetermined length, the motor 74 abuts on the stoppers 81d, so that the terminal 81 is not inserted further. In other words, the motor 74 is not brought close to the mounting surface 75a by the predetermined length or longer. An operator can complete the mounting of the motor to the circuit board 75 just by pressing the motor 74 to the terminal 81, without particularly considering the insertion length. Therefore, it is possible to improve the mounting operability.

Then, the worm gear 76a is mounted to the rotary shaft 74a of the motor 74. Alternatively, after the worm gear 76a is mounted to the rotary shaft 74a, the motor 74 may be mounted to the circuit board 75. Further, the shaft 73 having the worm wheel 76c mounted thereto is mounted to the circuit board 75. Specifically, as described above with reference to FIG. 4, the joint member 73b included in the shaft 73 is coupled with the rod 83a included in the potentiometer 83 mounted to the circuit board 75.

The shaft 73, the motor 74, the circuit board 75, the worm gear 76a and the worm wheel 76c unitized in this way are introduced into the internal space 71a through the opening part 71b of the box member 71.

Figure 7A:
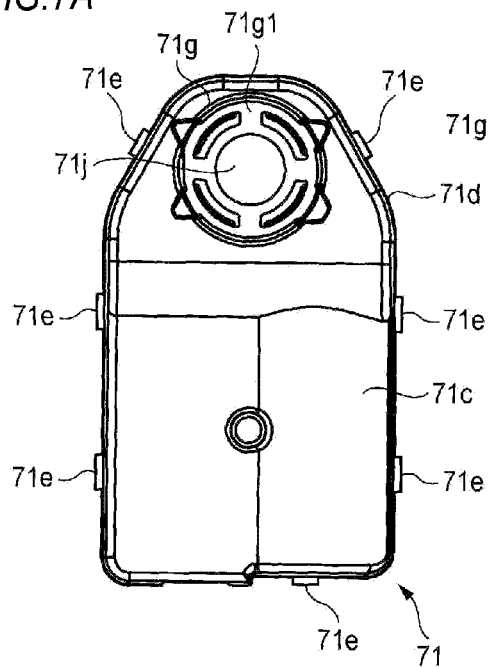
FIGS. 7A to 7C illustrate an outward appearance of a box member included in the actuator.
Figure 7B:
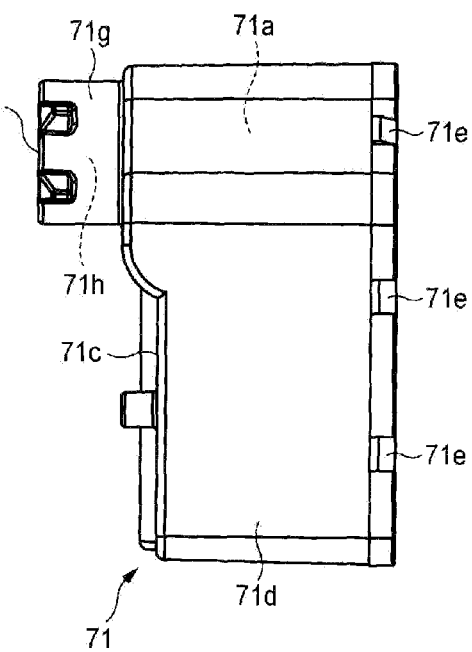
Figure 7C:
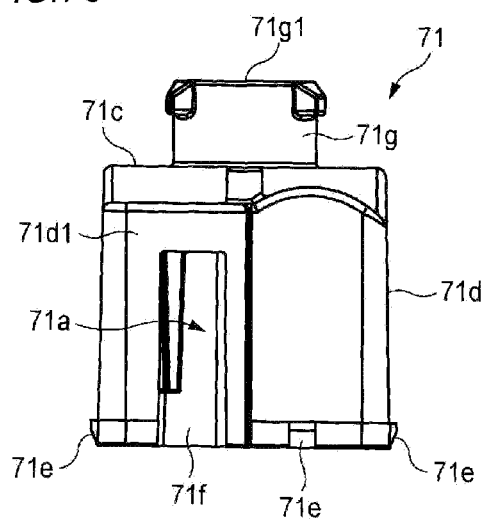

Subsequently, a configuration of the box member 71 is described in detail with reference to FIGS. 7A to 10. FIGS. 7A, 7B and 7C are respectively a front view, a right side view and a bottom view of the box member 71. The upper, lower, left, right, front and rear directions of the actuator 17 are defined on the basis of those drawings. However, the definition is simply made for convenience of description and does not limit the posture at the actual operational state of the actuator 17.

The box member 71 defines the internal space 71a by a front wall 71c and a peripheral wall 71d continuing to the front wall. A plurality of engaging claws 71f is formed at a plurality of places of an end edge portion of the opening part 71b-side of the peripheral wall 71d. A bottom wall part 71d1 of the peripheral wall 71d is formed with a slit 71f. A part of the internal space 71a is exposed through the slit 71f.

The front wall 71c of the box member 71 is provided with a cylindrical part 71g. The cylindrical part 71g defines therein an accommodation space 71h. The accommodation space 71h continues to the internal space 71a. A front end face 71g1 of the cylindrical part 71g is formed with an opening 71j.

Figure 8:
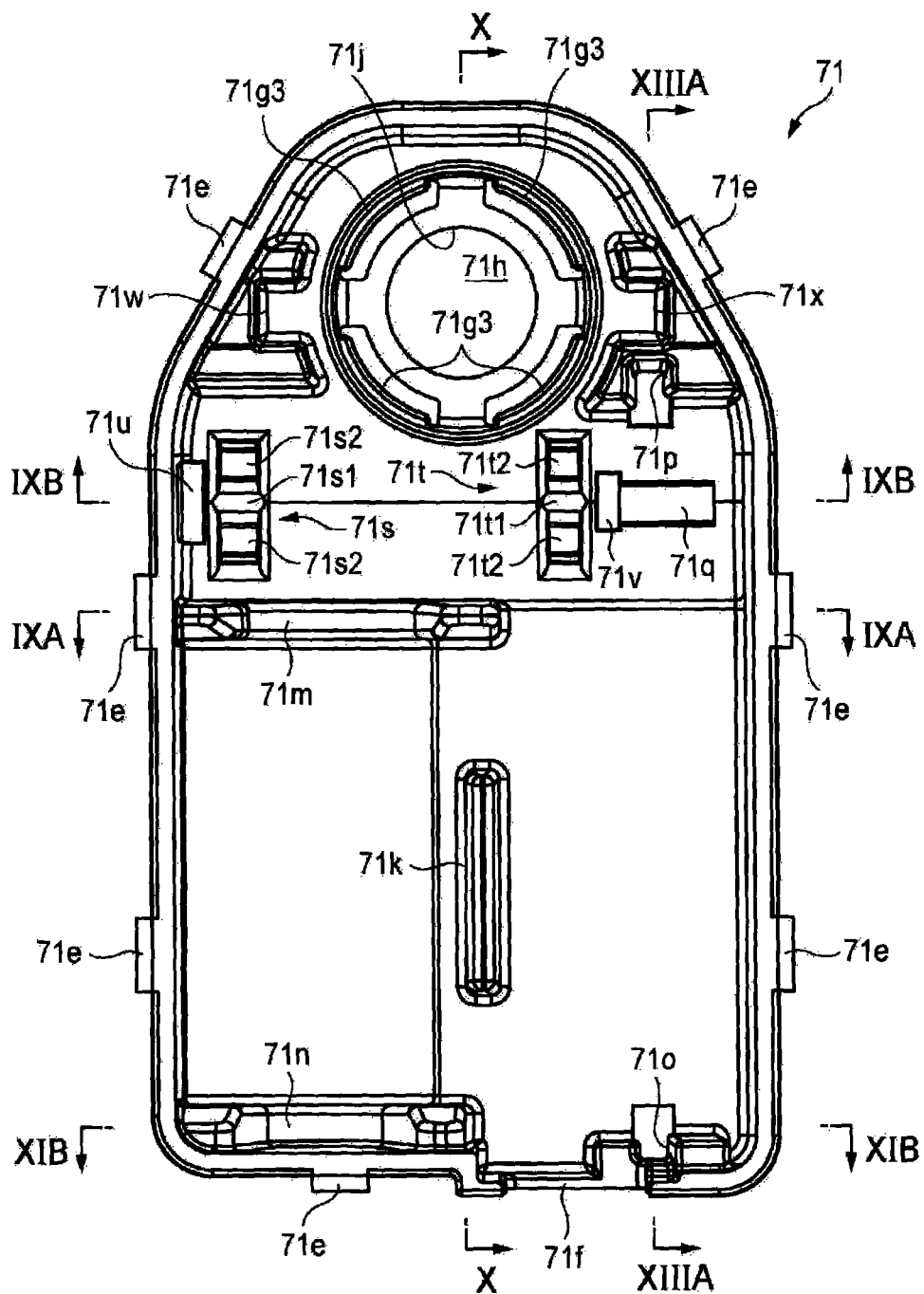
FIG. 8 illustrates an internal configuration of the box member.

FIG. 8 is a rear view of the box member 71. A backside of the front wall 71c in the internal space 71a is provided with a partition member 71k, a first motor holder 71m, a second motor holder 71n, a first circuit board guide rail 71o, a second circuit board guide rail 71p, a circuit board support protrusion 71q, a first bearing part 71s, a second bearing part 71t, a first seat part 71u, a second seat part 71v, a first shaft guide rail 71w and a second shaft guide rail 71x.

An area surrounded by the first motor holder 71m, the second motor holder 71n and the partition member 71k is a space for accommodating therein the motor 74. A space surrounded by the partition member 71k, the first circuit board guide rail 71o and the second circuit board guide rail 71p is a space for accommodating therein the circuit board 75. The circuit board support protrusion 71q is arranged in the space.

An area in which the first bearing part 71s and the second bearing part 71t are provided is a space for accommodating therein the transmission gear 76b. An area in which the first shaft guide rail 71w and the second shaft guide rail 71x is a space for accommodating therein the shaft 73 having the worm wheel 76c mounted thereto.

Before the shaft 73, the motor 74, the circuit board 75, the worm gear 76a and the worm wheel 76c unitized as described above are introduced into the internal space 71a of the box member 71, the transmission gear 76b is mounted to the first bearing part 71s and the second bearing part 71t.

Figure 9A:
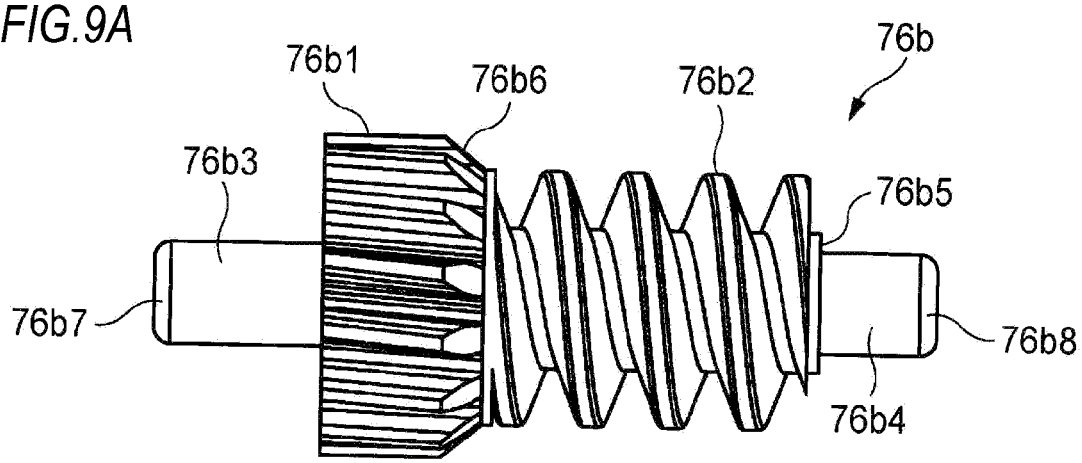
FIGS. 9A and 9B illustrate a transmission gear included in the actuator and arrangement thereof in the box member.

FIG. 9A is an enlarged side view of the transmission gear 76b. The transmission gear 76b has a first shaft part 76b3 and a second shaft part 76b4, in addition to the worm wheel part 76b1 and the worm gear part 76b2. The worm wheel part 76b1 is coaxially adjacent to the first shaft part 76b3, and the worm gear part 76b2 is coaxially adjacent to the second shaft part 76b4.

Figure 9B:
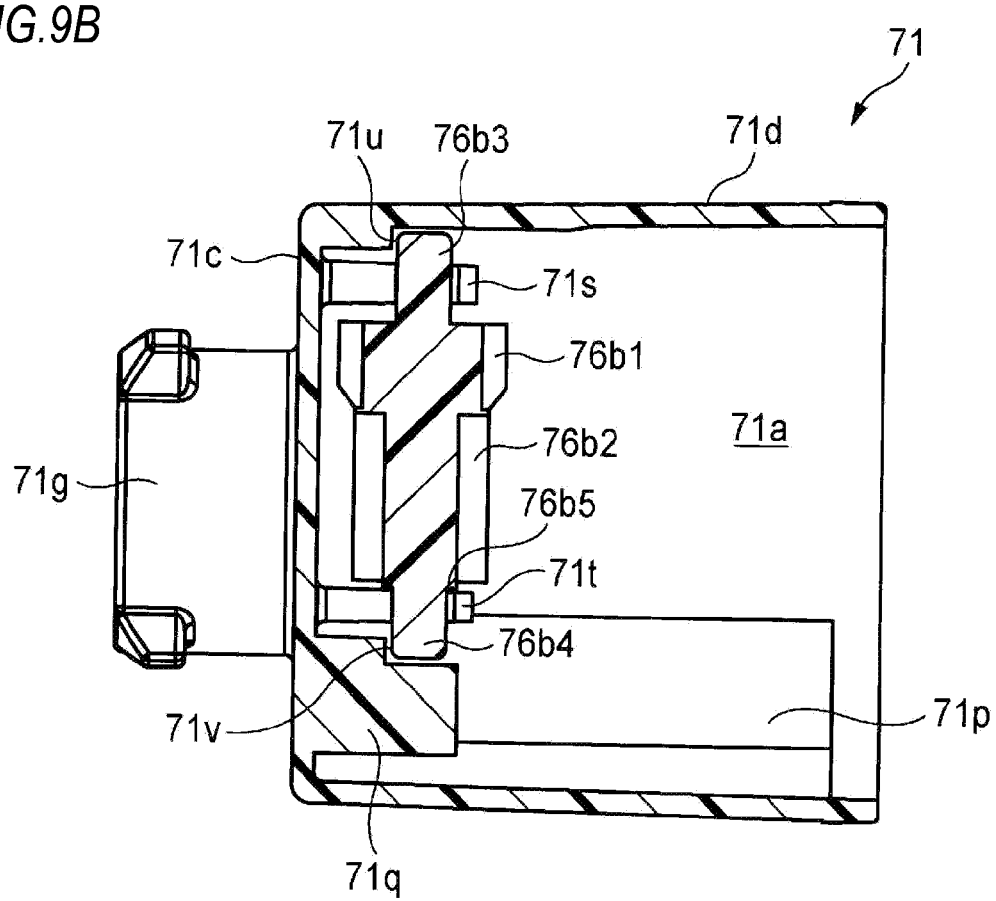

FIG. 9B is a sectional view taken along a line IXB-IXB of FIG. 8. In FIG. 9B, the first shaft guide rail 71w and the second shaft guide rail 71x are omitted for visibility. The first shaft part 76b3 and second shaft part 76b4 of the transmission gear 76b are respectively held by the first bearing part 71s and the second bearing part 71t.

Specifically, as shown in FIG. 8, the first bearing part 71s has a pair of holding pieces 71s2 defining a recess 71s1, and the second bearing part 71t has a pair of holding pieces 71t2 defining a recess 71t1. The first shaft part 76b3 and second shaft part 76b4 of the transmission gear 76b are respectively inserted into the recess 71s1 and the recess 71t1 and are thus held by the first bearing part 71s and the second bearing part 71t.

Figure 10:
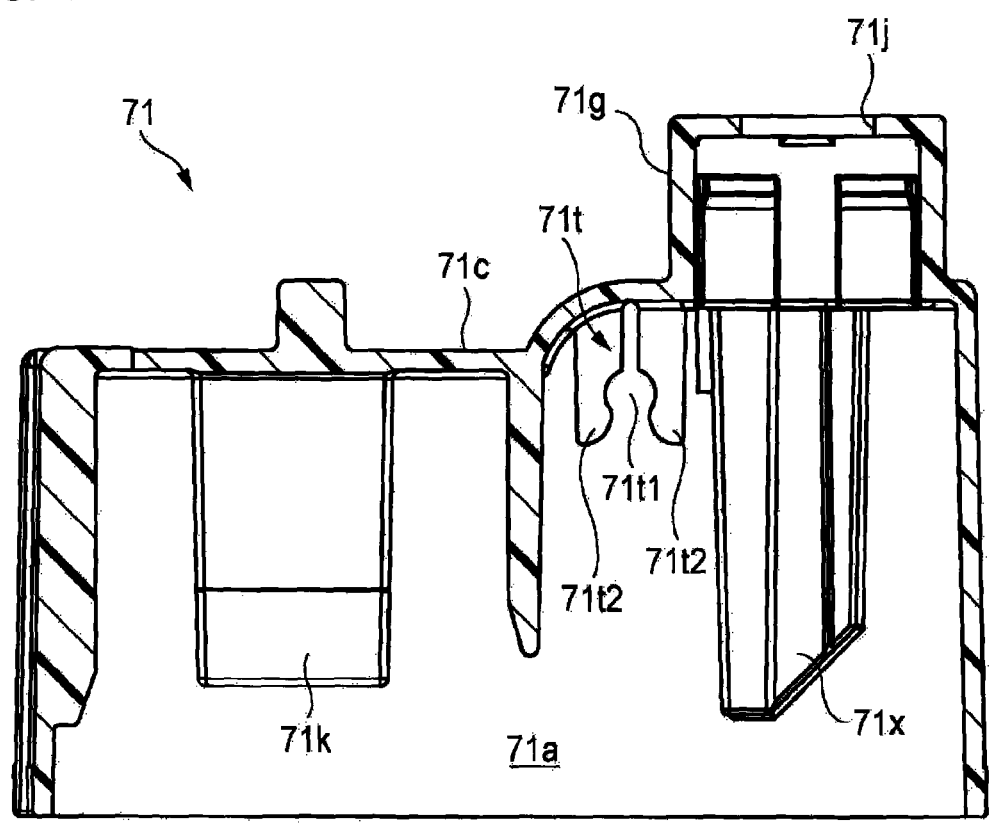
FIG. 10 is a sectional view illustrating the internal configuration of the box member.

FIG. 10 is a sectional view taken along a line X-X of FIG. 8. In FIG. 10, the second seat part 71v and the circuit board support protrusion 71q are omitted for visibility.

An entry of the recess 71t1 of the second bearing part 71t is formed to be narrower than a maximum diameter of the second shaft part 76b4 of the transmission gear 76b. For this reason, when mounting the transmission gear 76b, the second shaft part 76b4 is introduced into the recess 71t1 with flaring the pair of holding pieces 71t2. When the second shaft part 76b4 is arranged at a predetermined position, the pair of holding pieces 71t2 is returned to its original position to prevent the second shaft part 76b4 from separating from the recess 71t1. This is also the same for the recess 71s1 (the holding pieces 71s2) of the first bearing part 71s and the first shaft part 76b3 of the transmission gear 76b.

Since the first shaft part 76b3 and the second shaft part 76b4 positioned at both ends of the transmission gear 76b are firmly held by the first bearing part 71s and the second bearing part 71t, the rattling is suppressed when the transmission gear 76b is rotated. Thereby, it is possible to suppress an abnormal noise during the operation of the actuator 17.

As shown in FIGS. 8 and 9B, the first seat part 71u and the second seat part 71v are respectively arranged to be adjacent to the first bearing part 71s and the second bearing part 71t. A part of the first shaft part 76b3 of the transmission gear 76b, which is positioned outside the recess 71s1, is supported by a support surface of the first seat part 71u. Likewise, a part of the second shaft part 76b4 of the transmission gear 76b, which is positioned outside the recess 71t1, is supported by a support surface of the second seat part 71v.

When a mold for forming the box member 71 is deteriorated, it is not possible to obtain the holding pieces 71s2 of the first bearing part 71s having a predetermined size and the holding pieces 71t2 of the second bearing part 71t having a predetermined size, as designed. Therefore, the effect of suppressing the rattling may not be accomplished.

In the illustrative embodiment, the support surfaces of the first seat part 71u and the second seat part 71v are surfaces extending perpendicularly to the insertion direction of the first shaft part 76b3 and second shaft part 76b4 of the transmission gear 76b to the first bearing part 71s and second bearing part 71t. Therefore, the positions of the first shaft part 76b3 and second shaft part 76b4 in the insertion direction are restrained, so that it is possible to reduce the impact of the size change of the holding pieces 71s2, 71t2.

In other words, even when the first bearing part 71s and the second bearing part 71t are manufactured with a slightly deteriorated mold, it is possible to maintain the effect of suppressing the rattling of the transmission gear 76b, i.e., the effect of suppressing the abnormal noise of the actuator 17. Thereby, it is possible to prolong a useable life of the mold, thereby suppressing the manufacturing cost.

As shown in FIG. 9A, a stepped portion 76b5 wider than the recess 71t1 of the second bearing part 71t is formed between the worm gear part 76b2 and second shaft part 76b4 of the transmission gear 76b. The stepped portion 76b5 has a disc shape having a diameter smaller than the maximum diameter of the worm gear part 76b2 and larger than the second shaft part 76b4.

As shown in FIG. 9B, the stepped portion 76b5 is arranged to abut on sides of the holding pieces 71t2 of the second bearing part 71t at a state where the transmission gear 76b is mounted to the first bearing part 71s and the second bearing part 71t. Thereby, the axial position of the transmission gear 76b is restrained. The axial position of the first shaft part 76b3 of the transmission gear 76b is restrained by the peripheral wall 71d.

Therefore, it is possible to suppress the axial displacement upon the rotation of the transmission gear 76b, even in a layout where the axial position cannot be restrained by the peripheral wall 71d, like the second shaft part 76b4 of the transmission gear 76b. Therefore, it is possible to suppress the abnormal noise during the operation of the actuator 17.

As shown in FIG. 9A, a peripheral edge portion 76b7 of a tip surface of the first shaft part 76b3 is chamfered. According to this configuration, when the axial position is restrained by the peripheral wall 71d, it is possible to reduce a contact area with the first shaft part 76b3. Therefore, it is possible to smoothly rotate the transmission gear 76b.

A peripheral edge portion 76b8 of a tip surface of the second shaft part 76b4 is also chamfered. However, the chamfering may be omitted for the second shaft part 76b4 for which the position is not restrained by the peripheral wall 71d, like this illustrative embodiment.

As shown in FIG. 9A, the maximum diameter of the worm wheel part 76b1 is larger than the maximum diameter of the worm gear part 76b2. A part of the worm wheel part 76b1 is chamfered and is formed as an inclined surface 76b6 inclined towards the worm gear part 76b2.

A space resulting from the formation of the inclined surface 76b6 can be used to arrange the other element components to be accommodated in the internal space 71a of the box member 71. In this illustrative embodiment, as shown in FIG. 12, a part of the outer peripheral edge of the worm wheel 76c is accommodated in the corresponding space. Therefore, the using efficiency of the internal space 71a is improved. In other words, since it is possible to arrange the element components as close as possible, it is possible to make the box member 71, i.e., the actuator 17 small.

At a state where the transmission gear 76b is mounted to the first bearing part 71s and the second bearing part 71t, as described above, the unit of the shaft 73, the motor 74, the circuit board 75, the worm gear 76a and the worm wheel 76c is introduced into the internal space 71a of the box member 71.

Figure 11A:
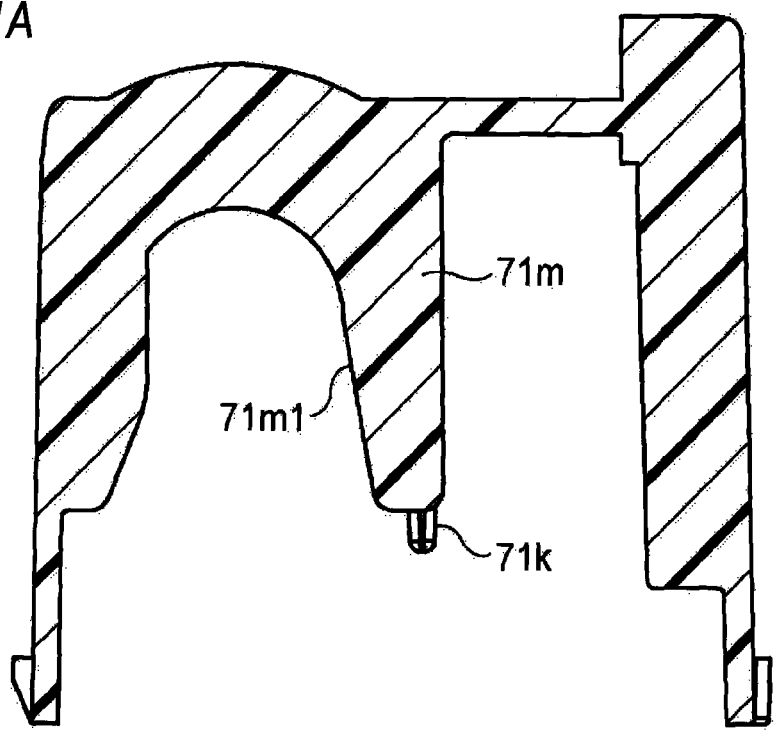
FIGS. 11A and 11B are sectional views illustrating the internal configuration of the box member.
Figure 11B:
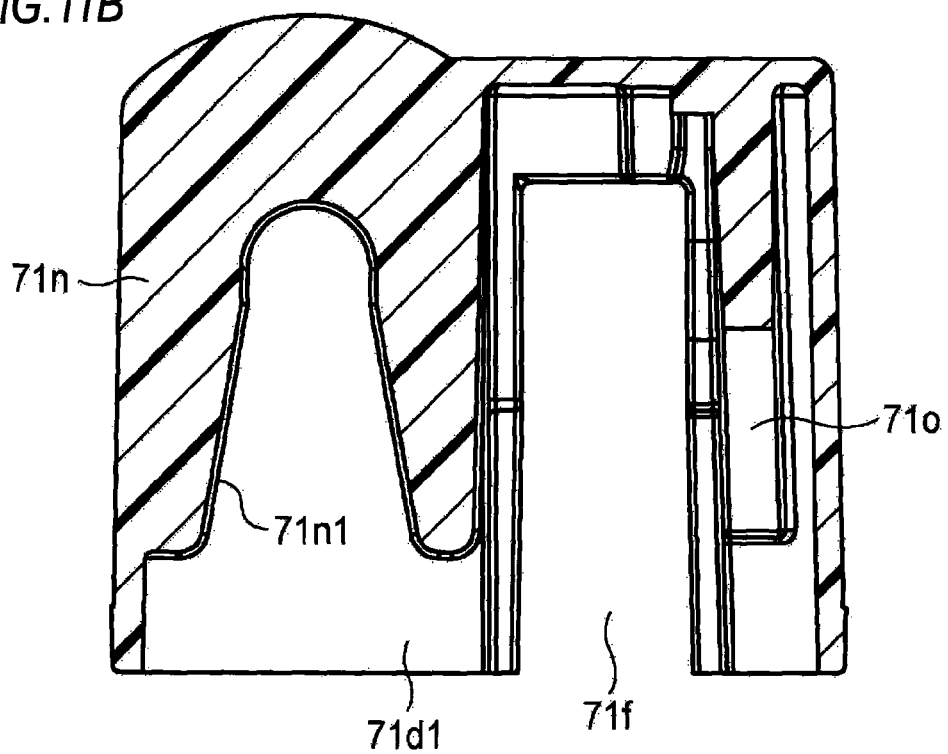

FIG. 11A is a sectional view taken along a line XIA-XIA of FIG. 8. In FIG. 11A, only a sectional shape of the first motor holder 71m and a positional relation of the partition member 71k are shown and the bottom wall part 71d1 is omitted for visibility. FIG. 11B is a sectional view taken along a line XIB-XIB of FIG. 8.

As shown in FIG. 12, the first motor holder 71m is a member for holding a front end 74c of the motor 74 introduced into the internal space 71a, and the second motor holder 71n is a member for holding a rear end 74d of the motor 74 introduced into the internal space 71a. In the meantime, as shown in FIG. 4, regarding the motor 74, a side having the rotary shaft 74a is referred to as the front end 74c of the case, and an opposite end portion thereof is referred to as the rear end 74d.

As shown in FIG. 11A, the first motor holder 71m has a recess 71m1. As shown in FIG. 11B, the second motor holder 71n has a recess 71n1. When the front end 74c and the rear end 74d, which are examples of a part of the motor 74, are inserted into the recess 71m1 and the recess 71n1, respectively, the motor 74 is held in the box member 71 by the first motor holder 71m and the second motor holder 71n.

The recess 71m1 has a shape widening towards an entry thereof. Likewise, the recess 71n1 has a shape widening towards an entry thereof. Therefore, it is possible to easily introduce the parts of the motor 74 into the gradually narrowing recesses 71m1, 71n1. The motor 74 is guided to a predetermined position by the recesses 71m1, 71n1 with being pressed towards the front wall 71c of the box member 71 and is then firmly held. In this way, since it is possible to smoothly introduce the motor 74, it is possible to avoid interference of the unit when it is introduced to the other element components.

As shown in FIGS. 8 and 10, the partition member 71k extends from a backside of the front wall 71c towards the opening part 71b in the internal space 71a of the box member 71. As shown in FIG. 12, when the circuit board 75 having the motor 74 mounted thereto is introduced into the internal space 71a, the partition member 71k is inserted between the motor 74 and the mounting surface 75a of the circuit board 75. More specifically, the partition member 71k abuts on the side of the motor 74 and faces the mounting surface 75a at an interval.

Thereby, the position of the motor 74 is restrained between the peripheral wall 71d of the box member 71 and the partition member 71k. In particular, the rotation of the motor 74 around the rotary shaft 74a, which is accompanied by the driving of the motor, is restrained. Therefore, it is possible to prevent a defect, which is caused due to the interference between the motor 74 and the electronic component 82 during the operation of the actuator 17.

As shown in FIG. 8, the first circuit board guide rail 71o and the second circuit board guide rail 71p are formed at positions facing both side edges of the circuit board 75, which is introduced into the internal space 71a of the box member 71 together with the motor 74. The circuit board 75 is brought close to the front wall 71c with the side edges thereof being guided by the first circuit board guide rail 71o and the second circuit board guide rail 71p. In the vicinity of the second circuit board guide rail 71p, the circuit board support protrusion 71q protruding from the backside of the front wall 71c towards the opening part 71b is formed.

Figure 4:
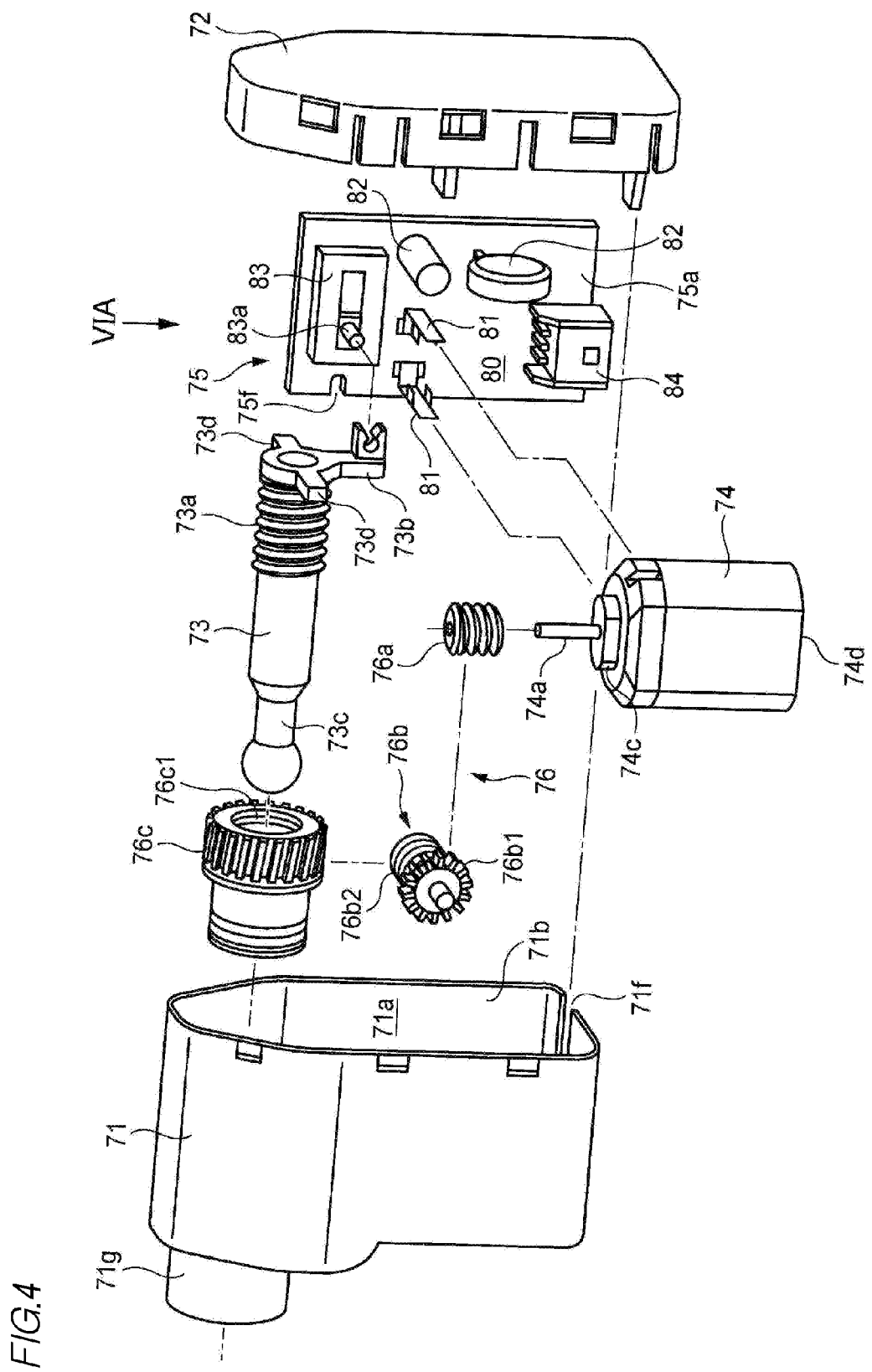
FIG. 4 is an exploded perspective view illustrating a configuration of the actuator.

As shown in FIG. 4, a side end edge of the circuit board 75 facing the circuit board support protrusion 71q is formed with a notch 75f. When the circuit board 75 introduced into the internal space 71a of the box member 71 is arranged at a predetermined position, the circuit board support protrusion 71q is tightly fitted into the notch 75f. Sizes of the circuit board support protrusion 71q and the notch 75f are set so that both are tightly fitted with each other and thus the circuit board support protrusion 71q can independently support the circuit board 75 in the internal space 71a.

Figure 13A:
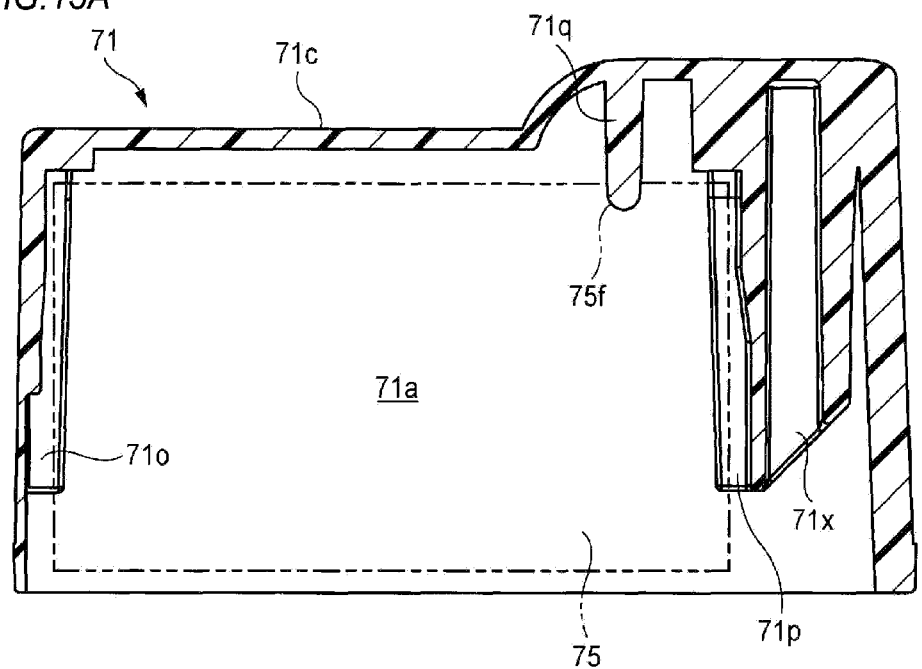
FIGS. 13A and 13B illustrate arrangement of the circuit board accommodated in the box member.
Figure 13B:
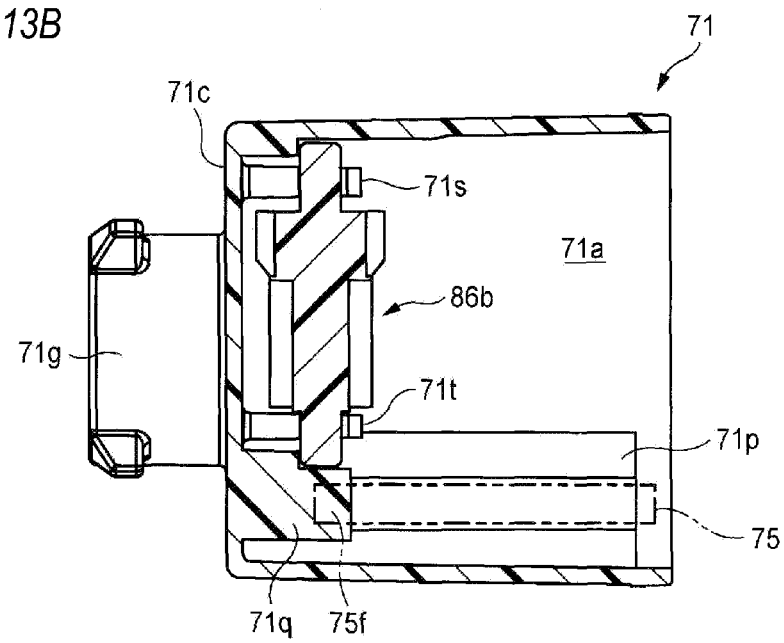

That is, at a state where the circuit board 75 is supported to the circuit board support protrusion 71q, a gap is formed between the first circuit board guide rail 71o and second circuit board guide rail 71p and the circuit board 75, as shown in FIGS. 13A and 13B. FIG. 13A is a sectional view taken along a line XIIIA-XIIIA of FIG. 8. FIG. 13B is a sectional view corresponding to FIG. 9B.

According to the above configuration, since the circuit board 75 is independently supported in the internal space 71a by the circuit board support protrusion 71q, it is possible to suppress the stress to the minimum, which is applied to the circuit board 75 after the circuit board is arranged at the predetermined position. Therefore, it is possible to avoid a damage of the mounted circuit due to distortion of the circuit board and to stabilize the operation of the actuator 17 and the operations of the lamp unit 10 and the headlight device 1.

In particular, the operation of introducing the circuit board 75 into the internal space 71a can be smoothly performed by the first circuit board guide rail 71o and the second circuit board guide rail 71p, and after the circuit board 75 is arranged at the predetermined position, the first circuit board guide rail 71o and the second circuit board guide rail 71p do not apply the stress to the circuit board 75, which is a cause of the distortion of the circuit board 75.

Also, the circuit board support protrusion 71q and the notch 75f extend in parallel with the mounting surface 75a, respectively. Therefore, the force for pressing the circuit board 75 to the internal space 71a so as to tightly fit the circuit board support protrusion and the notch to each other is applied in the direction parallel with the mounting surface 75a, so that a side end edge of the circuit board 75 is applied with the force. For this reason, as compared to a configuration where the pressing force is applied in a direction perpendicular to the mounting surface 75a, it is possible to considerably suppress the bending of the circuit board 75. Therefore, it is possible to avoid the damage of the mounted circuit, which is caused due to the distortion of the circuit board 75 occurring when introducing the circuit board into the internal space 71a, and to stabilize the operation of the actuator 17 and the operations of the lamp unit 10 and the headlight device 1.

As shown in FIG. 4, a rear end portion of the shaft 73 is formed with a pair of protrusions 73d, in addition to the joint member 73b. Each protrusion 73d extends in a radial direction of the shaft 73. When the shaft 73 is introduced into the internal space 71a of the box member 71, the respective protrusions 73d are arranged in the first shaft guide rail 71w and the second shaft guide rail 71x, as shown in FIG. 12.

The first shaft guide rail 71w and the second shaft guide rail 71x are respectively formed by increasing the thickness of a part of the peripheral wall 71d of the box member, and abut on the tips of the protrusions 73d of the shaft 73, respectively. Thereby, it is possible to restrain a radial position of the shaft 73 that is displaced in the axis direction thereof as the motor 74 is driven. Also, since the position restraint is performed at a place of which rigidity is improved by increasing the thickness of a part of the peripheral wall 71d, the restraint capability is unlikely to be deteriorated even when the shaft 73 is repeatedly displaced.

Also, each of the first shaft guide rail 71w and the second shaft guide rail 71x has a pair of ribs configured to support the tip of each protrusion 73d from both sides. Thereby, it is possible to restrain the position of the shaft 73 with respect to the direction perpendicular to the extending direction of the protrusion 73d. The shaft 73 is smoothly displaced with being guided to the first shaft guide rail 71w and the second shaft guide rail 71x, so that it is possible to suppress shaking or vibration of the displacement shaft or abnormal noise.

Figure 14A:
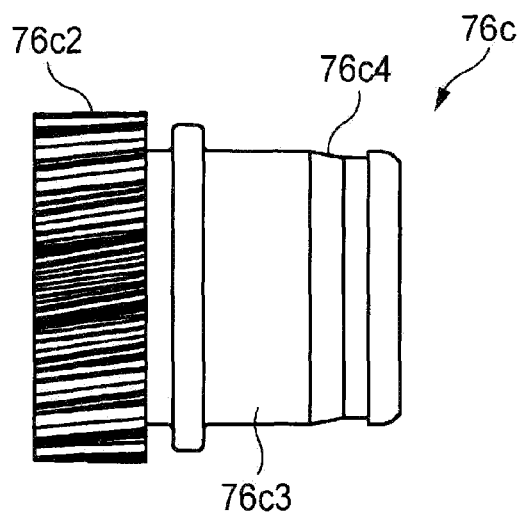
FIGS. 14A and 14B illustrate a worm wheel included in the actuator and arrangement thereof in the box member.
Figure 14B:
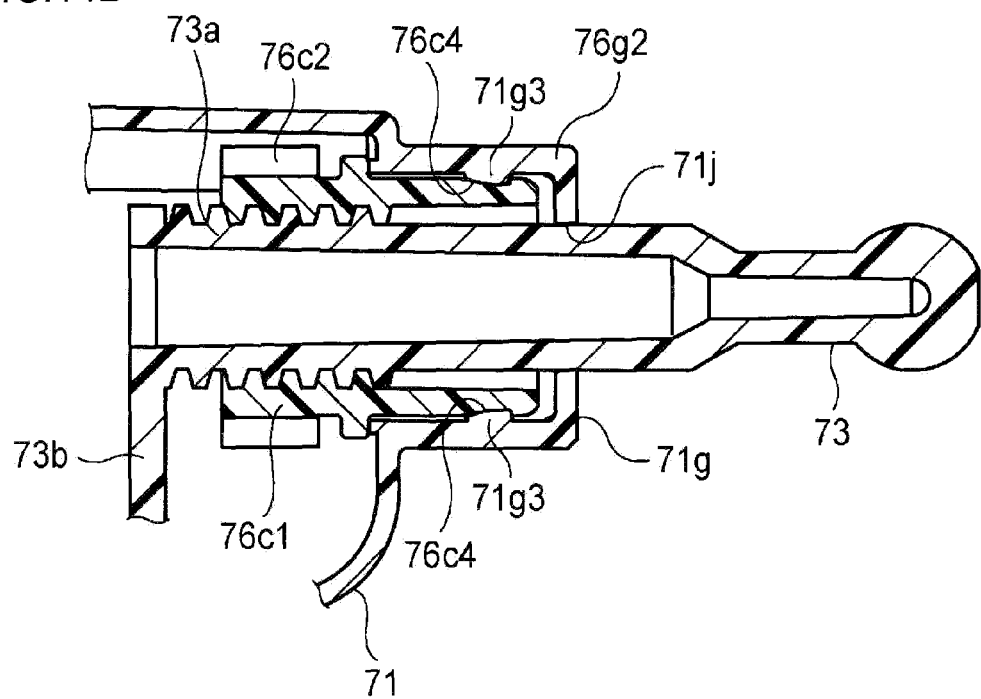

When the shaft 73 introduced into the internal space 71a of the box member 71 is arranged at the predetermined position, a tip portion 73c of the shaft 73 protrudes forward from the box member 71 through the opening 71j formed at the cylindrical part 71g provided at the front part of the box member 71, as shown in FIG. 14B. Also, the worm wheel 76c mounted to the outer periphery of the shaft 73 is accommodated in the accommodation space 71h formed in the cylindrical part 71g.

FIG. 14A is an enlarged side view of the worm wheel 76c (which is an example of the annular member). The worm wheel 76c has a gear part 76c2 and a cylindrical part 76c3, in addition the second screw part 76c1 (refer to FIGS. 4 and 14B) to be meshed with the first screw part 73a of the shaft 73. The gear part 76c2 is formed with teeth to be meshed with the worm gear part 76b2 of the transmission gear 76b. The cylindrical part 76c3 extends forward from the gear part 76c2. A part of the cylindrical part 76c3 is formed with a recess 76c4 having an annular shape.

As shown in FIG. 14B, the accommodation space 71h of the worm wheel 76c is defined by a single peripheral wall 76g2 of the cylindrical part 71g. Also, as shown in FIGS. 14B and 8, the peripheral wall 76g2 is partially increased in thickness to form four monolithic protrusions 76g3 protruding into the accommodation space 71h. When the worm wheel 76c is arranged at a predetermined position in the accommodation space 71h, each protrusion 76g3 is engaged with the recess 76c4, which is a part of the worm wheel 76c.

Each protrusion 76g3 has an inclined surface extending in a radially inward direction of the cylindrical part 71g towards the opening 71j. Therefore, each protrusion can be smoothly engaged with the worm wheel 76c inserted into the accommodation space 71h. When the inclined surface is a surface perpendicular to the insertion direction of the worm wheel, it is necessary to configure the worm wheel to be deformable in the radially inward direction so as to facilitate the engaging. For example, when the worm wheel is formed with a slit, the corresponding deformation is possible. In this case, it is not possible to avoid the rigidity degradation of the worm wheel. However, according to the illustrative embodiment, since it is possible to secure the rigidity of the worm wheel, the deformation, which is caused due to the load, is suppressed. Therefore, it is possible to keep the stable rotating operation.

By the above configuration, the worm wheel 76c is accommodated to be rotatable around the shaft in the accommodation space 71h with the axial displacement thereof being restrained. Since the protrusion 76g3 enabling the restraint is monolithically formed by increasing the thickness of a part of the single peripheral wall 76g2, it is possible to secure the sufficient strength. Also, it is possible to remarkably simplify the mold for obtaining the corresponding configuration. Therefore, it is possible to suppress the manufacturing cost.

When the unit of the shaft 73, the motor 74, the circuit board 75, the worm gear 76a and the worm wheel 76c is arranged at a predetermined position, as described above, the worm gear 76a mounted to the rotary shaft 74a of the motor 74 is meshed with the worm wheel part 76b1 of the transmission gear 76b and the worm wheel 76c mounted to the shaft 73 is meshed with the worm gear part 76b2, as shown in FIG. 12. Thereby, the gear mechanism 76 for converting the rotation of the rotary shaft 74a into the axial displacement of the shaft 73 is configured.

Also, the connector 84 mounted on the circuit board 75 is arranged in the slit 71f (refer to FIGS. 7C and 11B) formed at the bottom wall part 71d1 of the box member 71. Since the connection terminal of the connector 84 is exposed to the outside of the box member 71, the connection with a counterpart connector is possible.

Figure 15A:
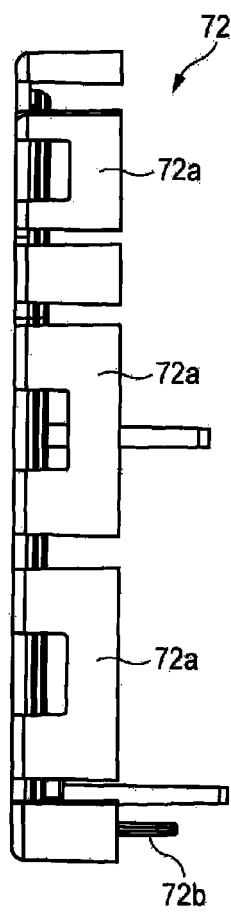
FIGS. 15A to 15C illustrate a configuration of a cover member included in the actuator.
Figure 15B:
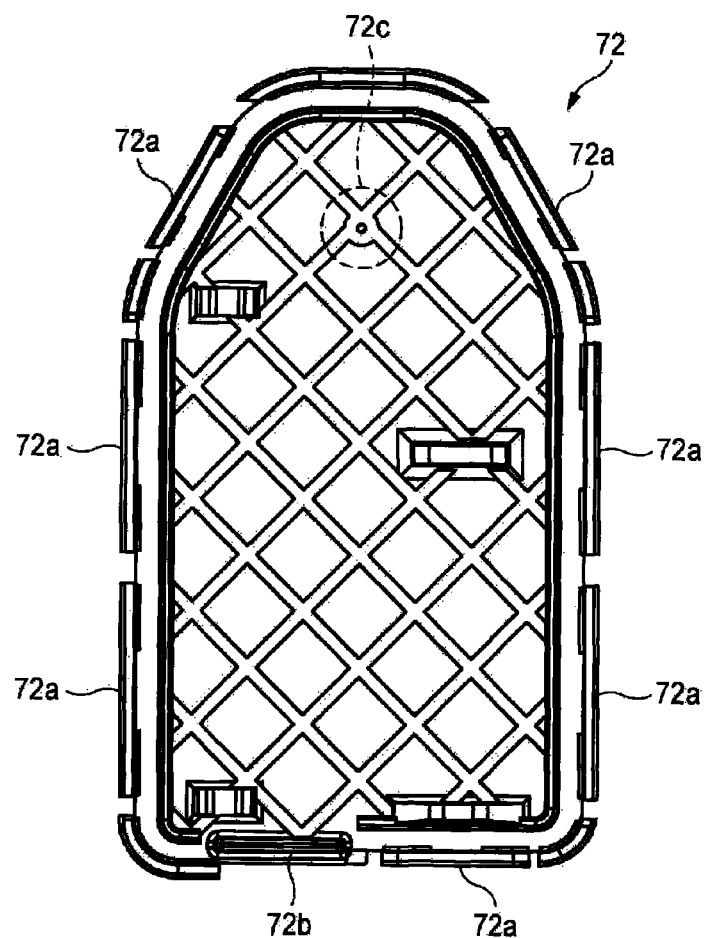
Figure 15C:
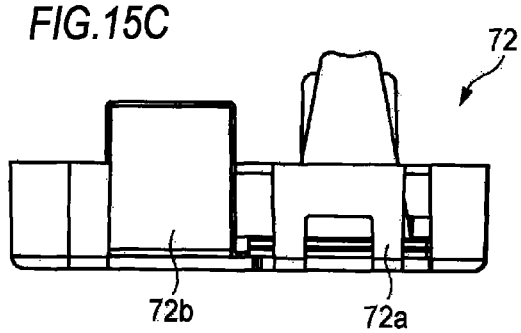

FIGS. 15A to 15C illustrate an outward appearance of the cover member 72. FIG. 15A is a left side view of the cover member 72. FIG. 15B is a front view of the cover member 72. FIG. 15C is a bottom view of the cover member 72. A peripheral edge portion of the cover member 72 is provided with a plurality of engaging pieces 72a, and each engaging piece is formed with an engaging hole. A bottom part of the cover member 72 is formed with a blocking plate 72b extending forward at a more inner side than any one of the engaging pieces 72a.

Figure 16A:
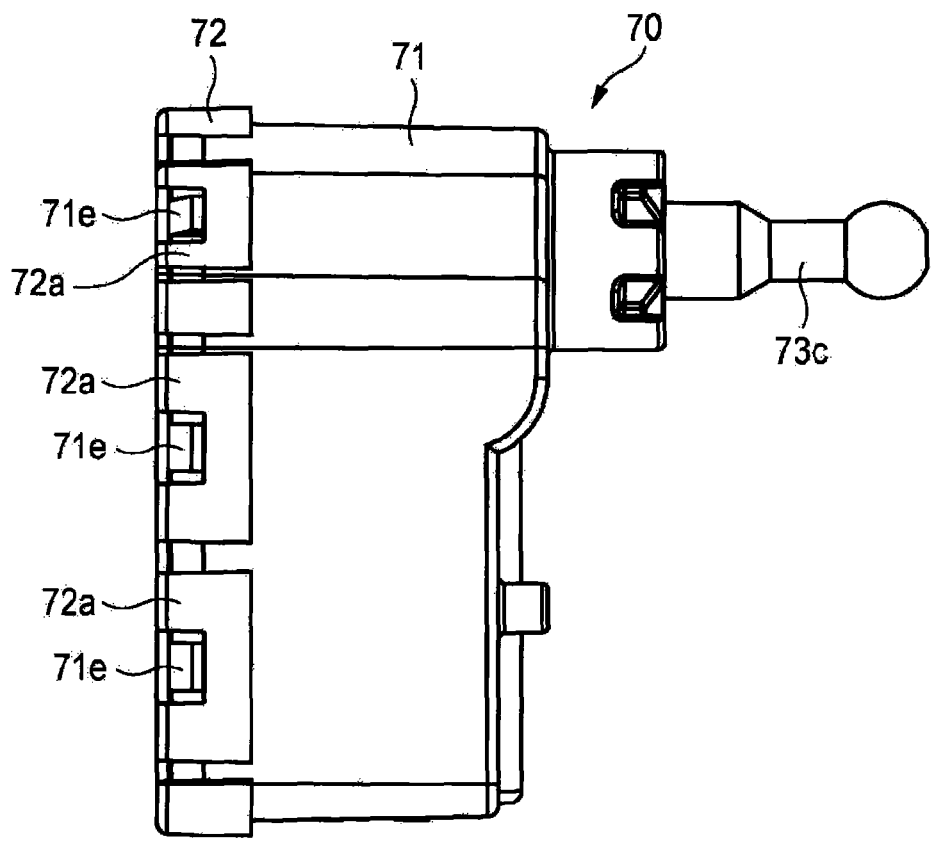
FIGS. 16A and 16B illustrate an outward appearance of the box member having the cover member mounted thereto.

As shown in FIG. 16A, the cover member 72 is mounted to the box member 71 to block the opening part 71b, thereby forming the case 70. At this time, each of the engaging claws 71e provided for the box member 71 is engaged with the engaging hole of the corresponding engaging piece 72a provided for the cover member 72, thereby preventing the cover member 72 from separating from the box member 71.

Figure 16B:
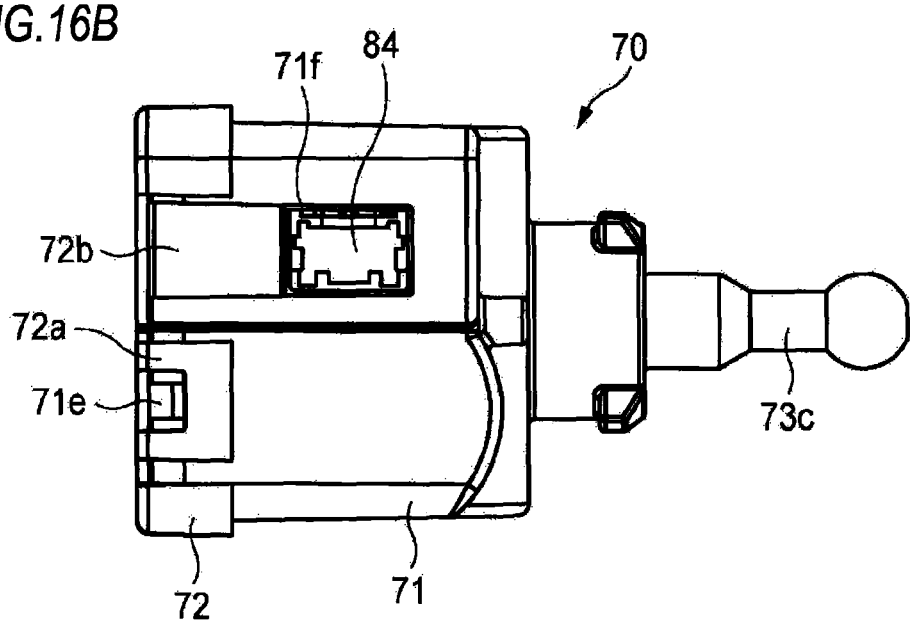

As shown in FIG. 16B, the blocking plate 72b (which is an example of a part of the cover member) is configured to block a part of the slit 71f formed at the box member 71. A longitudinal size of the blocking plate 72b corresponds to a size obtained by subtracting a width size of the connector 84 in the longitudinal direction of the slit 71f from a longitudinal size of the slit 71f. That is, the longitudinal size of the blocking plate 72b corresponds to a length of a part, which is opened without being blocked by the connector 84 arranged in the slit 71f, of the entire length of the slit 71f. Also, a width size of the blocking plate 72b is larger than a width size of the slit 71f.

Therefore, the blocking plate 72b is configured to face the slit 71f at the inner side of the bottom wall part 71d1 and to contact an inner surface of the bottom wall part 71d1 at both end edges thereof in the width direction. By this overlapping structure, it is possible to prevent the static electricity from being introduced by closing a gap formed around the connector 84. Thereby, it is possible to prevent an unexpected malfunction of the motor driving circuit 80 or damage of the electronic component, which is accompanied by the static electricity.

According to the illustrative embodiment, the circuit board 75 is arranged inside the case 70 so that the mounting surface 75a is parallel with the axis direction of the shaft 73. Therefore, as compared to a configuration where the mounting surface is arranged to be perpendicular to the axis direction of the shaft 73 (refer to Patent Document 1), it is possible to remarkably reduce a width size of the case 70 in the left-right direction for which the miniaturization is more required than the displacement direction of the shaft 73, i.e., the axis direction.

For example, as shown in FIGS. 1 to 3B, according to the illustrative embodiment, the left-right direction of the case 70 corresponds to the vertical direction of the lamp unit 10. For this reason, it is possible to arrange the actuator 17 in a narrow space, which highly contributes to the miniaturization of the lamp unit 10.

The illustrative embodiment is provided so as to easily understand the present invention and does not limit the present invention. It is obvious that the present invention can be changed and modified without departing from the gist thereof and includes equivalents thereto.

It is not necessarily required that the motor driving circuit 80 should be entirely mounted on the circuit board 75. A part of the circuit elements thereof may be included in an external circuit that is connected through the connector 84.

The arrangements and shapes of the circuit board support protrusion 71q and the notch 75f of the circuit board 75 are arbitrarily made inasmuch as the circuit board support protrusion 71q of the box member 71 can independently support the circuit board 75 in the internal space 71a.

The gear mechanism 76 is not necessarily configured by the worm gear 76a, the transmission gear 76b having the worm wheel part 76b1 and the worm gear part 76b2, and the worm wheel 76c. That is, any configuration can be adopted as long as the rotation of the rotary shaft 74a of the motor 74 can be converted into the axial displacement of the shaft 73. For example, the worm gear 76a may be configured as a worm wheel, the worm wheel 76c may be configured as a worm gear, and the relation of the worm wheel part 76b1 and worm gear part 76b2 of the transmission gear 76b may be inversely configured.

The stepped portion 76b5 included in the transmission gear 76b is not necessarily provided between the worm gear part 76b2 and the second shaft part 76b4. The stepped portion 76b5 may be provided at a side at which the axial position of the transmission gear 76b cannot be restrained by the peripheral wall 71d of the box member 71. That is, if the first shaft part 76b3 cannot be supported by the peripheral wall 71d, the stepped portion 76b5 is provided between the worm wheel part 76b1 and the first shaft part 76b3. For a layout where the second shaft part 76b4 can be supported by the peripheral wall 71d, the stepped portion 76b5 provided between the worm gear part 76b2 and the second shaft part 76b4 may be omitted.

The reference position of the optical axis Ax of the projection lens 14 is adjusted using the aiming mechanism 19. However, the actuator 17 and the aiming mechanism 19 are not necessarily connected using the joint member 92. For example, as shown with the broken line in FIG. 15B, a screw hole 72c may be formed at a position of the cover member 72 coaxial with the shaft 73. In this case, like the configuration disclosed in Patent Document 1, the shaft part 91b of the aiming screw 91 may be inserted into the screw hole 72c and the tip of the shaft part 91b may be connected to a rear end of the shaft 73.

The target to be displaced by the actuator 17 is not necessarily in the direction of the optical axis Ax of the projection lens 14. That is, a variety of components or mechanisms of which a direction and a position should be changed may be targeted.

That is, the light device to which the actuator 17 is mounted is not limited to the headlight device 1. The present invention can be applied to an appropriate vehicle lighting device inasmuch as it has a component or mechanism of which a direction and a position should be changed.

The present application is based on Japanese Patent Application No. 2013-020792 filed on Feb. 5, 2013, Japanese Patent Application No. 2013-020793 filed on Feb. 5, 2013, Japanese Patent Application No. 2013-020794 filed on Feb. 5, 2013 and Japanese Patent Application No. 2013-020795 filed on Feb. 5, 2013, the contents of which are herein incorporated by reference.

What is claimed is:
1. An actuator comprising:
a case having an opening;
a shaft accommodated inside the case and having a tip protruding towards an outside of the case through the opening;
a motor accommodated inside the case and configured to displace the shaft in an axis direction thereof; and
a circuit board accommodated inside the case and having a mounting surface on which at least a part of a circuit configured to drive the motor is mounted,
wherein an end edge of the circuit board is formed with a notch,
wherein a protrusion is formed inside the case, and
wherein the protrusion is fitted into the notch to independently support the circuit board inside the case.

2. The actuator according to claim 1,
wherein the notch and the protrusion extend in a direction along which the circuit board is introduced into the case, and
wherein the direction along which the circuit board is introduced into the case is parallel with the mounting surface.
3. The actuator according to claim 1,
wherein the case is formed therein with a rail extending in the direction along which the circuit board is introduced into the case, and
wherein a gap is formed between the circuit board and the rail at a state where the circuit board is supported by the protrusion.
4. The actuator according to claim 1,
wherein the circuit board is arranged inside the case so that the mounting surface is parallel with the axis direction of the shaft.
5. The actuator according to claim 4,
wherein the motor is arranged at a position facing the mounting surface inside the case, and
wherein the case is formed therein with a partition member to be inserted between the motor and the mounting surface.
6. The actuator according to claim 1,
wherein the mounting surface is mounted thereon a terminal to be electrically connected to the driving circuit and to be inserted into the motor, and
wherein the terminal includes:
a first part extending in a direction perpendicular to the mounting surface; and
a second part provided at a predetermined distance from a tip of the first part and extending in a direction parallel with the mounting surface.
7. The actuator according to claim 1,
wherein the case is formed therein with a holder having a recess,
wherein the holder is configured to hold the motor inside the case by inserting a part of the motor into the recess, and
wherein the recess has a shape of which a width increases towards an entry thereof.
8. The actuator according to claim 1,
wherein the case has a box member having an opening part and a cover member configured to close the opening part,
wherein one side of the box member is formed with a slit configured to communicate with the opening part,
wherein the mounting surface is mounted thereon with a connector electrically connected to the driving circuit,
wherein at a state where the circuit board is accommodated in the box member through the opening part, a part of the connector is arranged in the slit, and
wherein at a state where the cover member closes the opening part, a part of the cover member closes a part of the slit.
9. The actuator according to claim 1,
wherein the case is formed with a screw hole at a position coaxial with the shaft.
10. A lighting device to be mounted on a vehicle, the lighting device being configured so that a part thereof is displaceable in a predetermined direction by the shaft included in the actuator according to claim 1.

* * * * *